(12) United States Patent
Nam

(10) Patent No.: US 11,082,050 B2
(45) Date of Patent: Aug. 3, 2021

(54) CLOCK DISTRIBUTION CIRCUIT USING ADJUSTABLE PHASE CONTROL AND VOLTAGE CONVERTER INCLUDING THE SAME

(71) Applicant: Samsung Electronics Co., Ltd., Suwon-si (KR)

(72) Inventor: Hyunseok Nam, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/000,642

(22) Filed: Aug. 24, 2020

(65) Prior Publication Data

US 2021/0184683 A1    Jun. 17, 2021

(30) Foreign Application Priority Data

Dec. 13, 2019  (KR) .................. 10-2019-0166613

(51) Int. Cl.
| | |
|---|---|
| *H03L 7/081* | (2006.01) |
| *H03L 7/087* | (2006.01) |
| *H02M 3/155* | (2006.01) |
| *H02M 3/156* | (2006.01) |

(52) U.S. Cl.
CPC .......... *H03L 7/0816* (2013.01); *H02M 3/155* (2013.01); *H02M 3/156* (2013.01); *H03L 7/087* (2013.01)

(58) Field of Classification Search
CPC ....... H03L 7/0816; H03L 7/085; H03L 7/087; H02M 3/155; H02M 3/156; H02M 3/1563; H02M 3/157; H02M 3/158; H02M 3/1582; H02M 3/1584; H02M 3/1588; H02M 2003/1552; H02M 2003/1555; H02M 2003/1557; H02M 2003/1566; H02M 2003/1586
See application file for complete search history.

(56) References Cited

U.S. PATENT DOCUMENTS

| | | |
|---|---|---|
| 7,109,691 B2 | 9/2006 | Brooks et al. |
| 7,268,448 B2 | 9/2007 | Hasegawa |
| 7,923,860 B2 | 4/2011 | Furuse et al. |
| (Continued) | | |

FOREIGN PATENT DOCUMENTS

JP        4609400 B2    1/2011

*Primary Examiner* — Diana J. Cheng
(74) *Attorney, Agent, or Firm* — Harness, Dickey & Pierce, P.L.C.

(57) ABSTRACT

A clock distribution circuit including a Phase Locked Loop (PLL), a first Phase Detecting and Converting (PDC) circuit, a second PDC circuit, and a clock generating and compensating (CGC) circuit may be provided. The PLL may generate reference clock signals. The first PDC circuit may generate input phase difference voltages based on phase differences between respective pairs of two reference clock signals among the reference clock signals. The second PDC circuit may generate output phase difference voltages based on phase differences between respective pairs of two power switching signals among power switching signals received from external switching regulators. The CGC circuit may generate input clock signals provided to the plurality of external switching regulators by shifting phases of the reference clock signals, and additionally control a phase of at least one of the input clock signals based on the input phase difference voltages and the output phase difference voltages.

20 Claims, 17 Drawing Sheets

(56) References Cited

U.S. PATENT DOCUMENTS

| | | |
|---|---|---|
| 7,928,704 B2 | 4/2011 | Huang |
| 8,058,856 B2 | 11/2011 | Huang |
| 8,319,485 B2 | 11/2012 | Philpott |
| 8,878,501 B2 | 11/2014 | Kalje et al. |
| 9,442,140 B2 | 9/2016 | Bansal et al. |
| 10,069,423 B2 | 9/2018 | Hussain et al. |
| 2006/0164366 A1* | 7/2006 | Yu .......................... G09G 5/18 345/98 |
| 2018/0041117 A1 | 2/2018 | Gong |

* cited by examiner

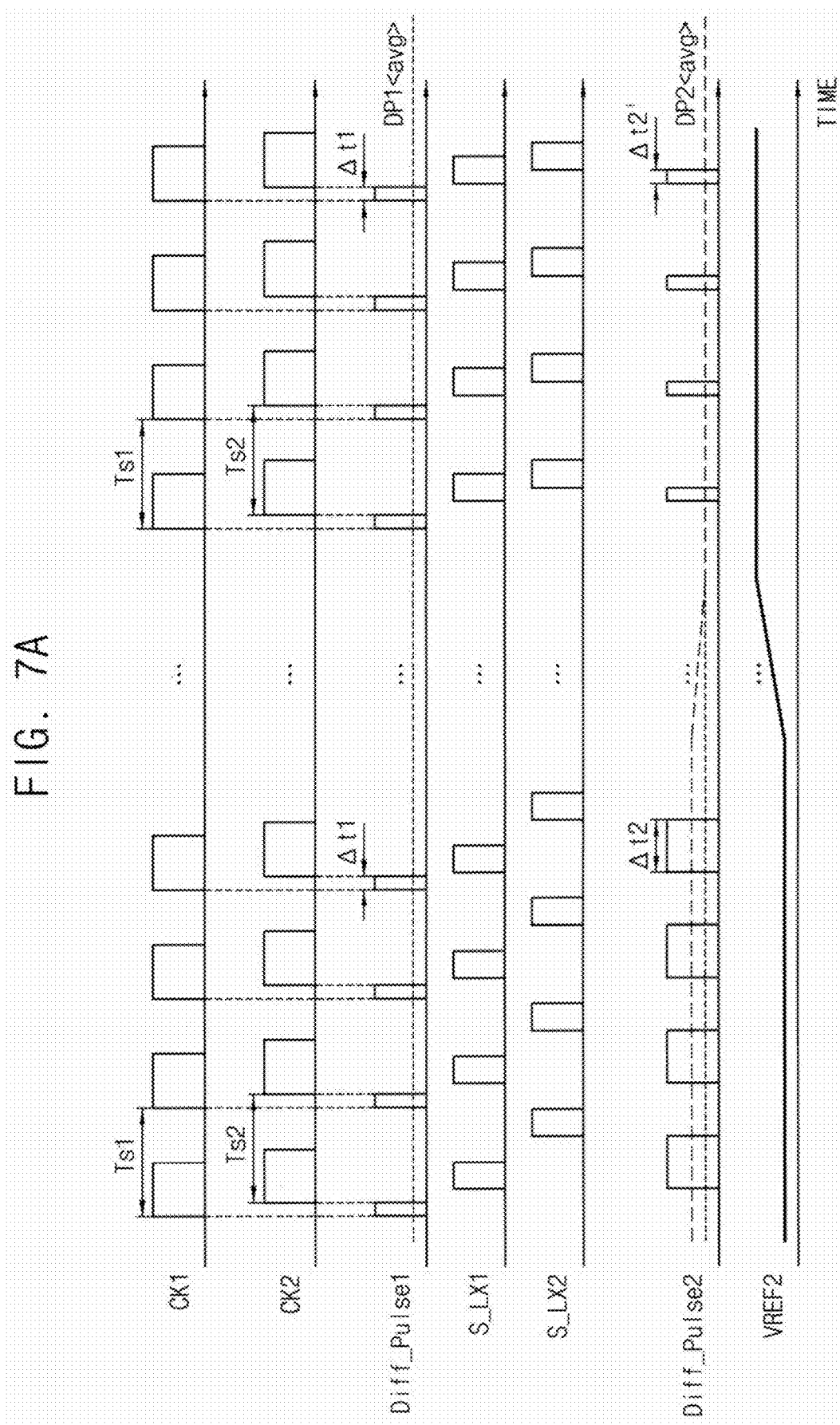

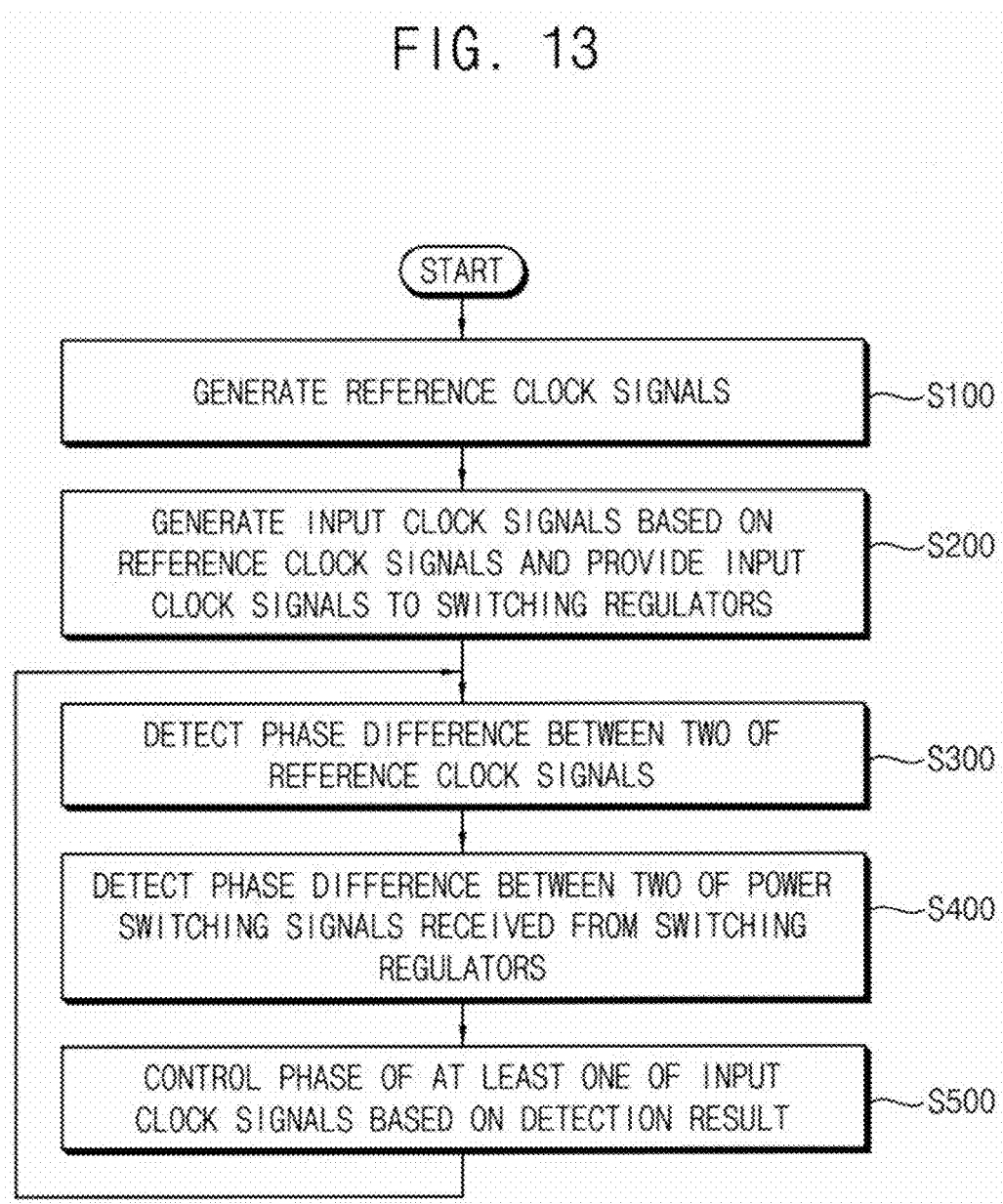

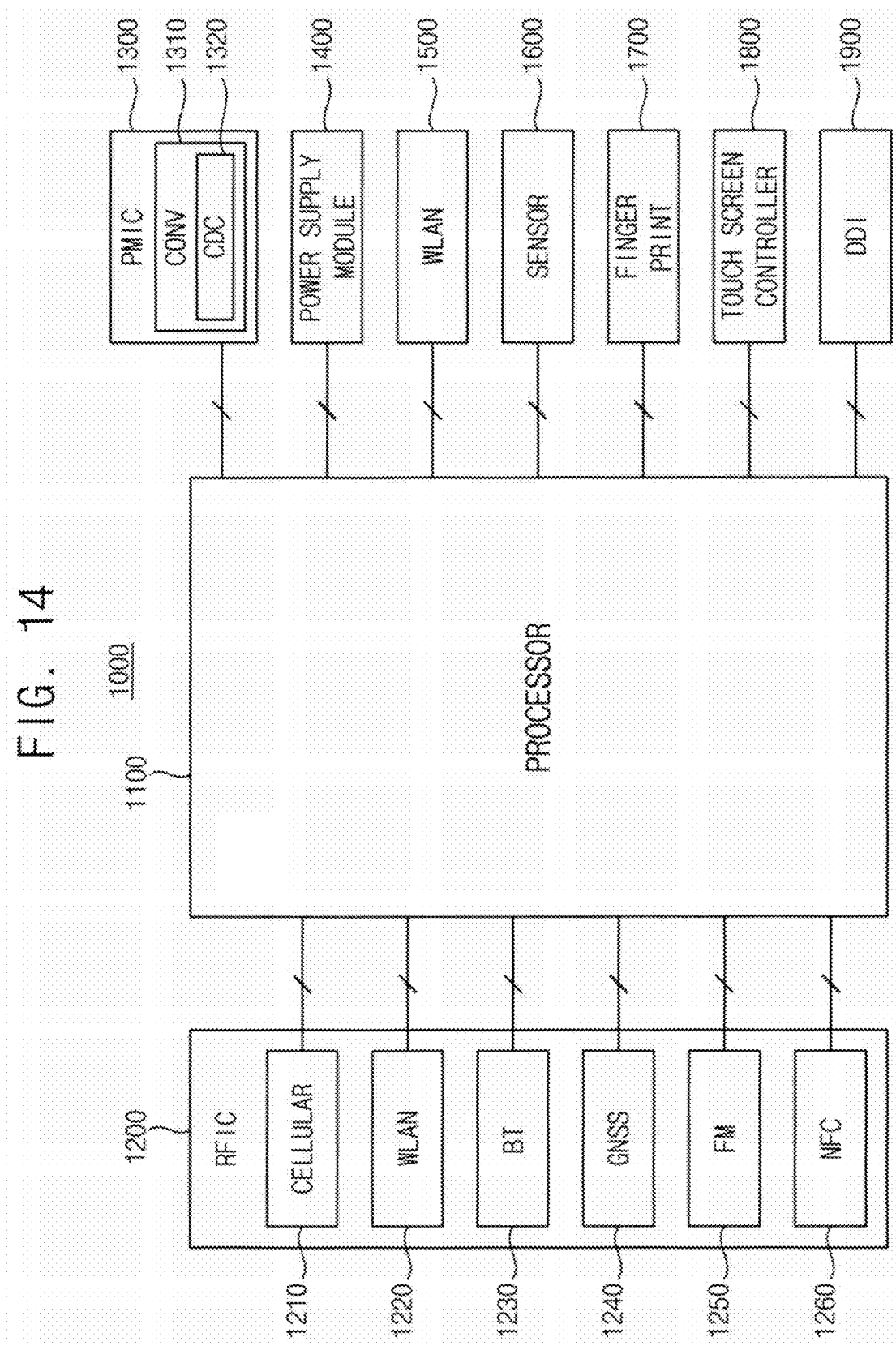

CLOCK DISTRIBUTION CIRCUIT USING ADJUSTABLE PHASE CONTROL AND VOLTAGE CONVERTER INCLUDING THE SAME

CROSS-REFERENCE TO RELATED APPLICATION

This application claims priority under 35 USC § 119 to Korean Patent Application No. 10-2019-0166613, filed on Dec. 13, 2019 in the Korean Intellectual Property Office (KIPO), the contents of which are herein incorporated by reference in their entirety.

BACKGROUND

1. Technical Field

Example embodiments relate to semiconductor integrated circuits, and more particularly to clock distribution circuits using adjustable phase control and/or voltage converters including the clock distribution circuits.

2. Description of the Related Art

A voltage converter that converts one direct current (DC) voltage into another DC voltage having a different voltage level is an essential technology in the field of supplying power to electronic devices. The voltage converter may be used in various fields, such as mobile devices (e.g., mobile phones) or electric vehicles, which require power to operate the products. Such voltage converter should be implemented with high performance and high efficiency through an integrated circuit design.

Recently, a power management integrated circuit (PMIC) that supplies power to a plurality of components included in one system has been implemented as a separate chip. As the number of switching regulators included in the PMIC increases and the amount of current supplied by the PMIC increases, the influence of electromagnetic interference (EMI) at the system level increases and the input capacitance of the PMIC increases. This not only degrades the performance of the entire system, but also increases the cost. For example, when all the switching regulators supply power at the same time, the characteristics of the PMIC may be degraded due to the instantaneous large changes in voltage and current, and the EMI may occur.

SUMMARY

At least one example embodiment of the present disclosure provides a clock distribution circuit capable of efficiently operating switching times of a plurality of switching regulators.

At least one example embodiment of the present disclosure provides a voltage converter capable of efficiently operating switching times of a plurality of switching regulators using the clock distribution circuit.

According to some example embodiments, a clock distribution circuit may include a phase locked loop (PLL), a first phase detecting and converting circuit, a second phase detecting and converting circuit, and a clock generating and compensating circuit. The phase locked loop may generate a plurality of reference clock signals. The first phase detecting and converting circuit may generate a plurality of input phase difference voltages based on phase differences between respective pairs of two reference clock signals among the plurality of reference clock signals. The second phase detecting and converting circuit may generate a plurality of output phase difference voltages based on phase differences between respective pairs of two power switching signals among a plurality of power switching signals received from a plurality of external switching regulators. The clock generating and compensating circuit may generate a plurality of input clock signals to be provided to the plurality of external switching regulators by shifting phases of the plurality of reference clock signals, and control a phase of at least one of the plurality of input clock signals based on the plurality of input phase difference voltages and the plurality of output phase difference voltages.

According to some example embodiments, a voltage converter may include a clock distribution circuit and a plurality of switching regulators. The clock distribution circuit may generate a plurality of input clock signals, and adaptively adjust a phase of at least one of the plurality of input clock signals. The plurality of switching regulators may include a plurality of power switching nodes, and generate a plurality of output voltages based on the plurality of input clock signals. The clock distribution circuit may include a phase locked loop (PLL), a first phase detecting and converting circuit, a second phase detecting and converting circuit, and a clock generating and compensating circuit. The phase locked loop may generate a plurality of reference clock signals. The first phase detecting and converting circuit may generate a plurality of input phase difference voltages based on phase differences between respective pairs of two reference clock signals among the plurality of reference clock signals. The second phase detecting and converting circuit may generate a plurality of output phase difference voltages based on phase differences between respective pairs of two power switching signals among a plurality of power switching signals received from the plurality of power switching nodes. The clock generating and compensating circuit may generate the plurality of input clock signals by shifting phases of the plurality of reference clock signals, and control the phase of the at least one of the plurality of input clock signals based on the plurality of input phase difference voltages and the plurality of output phase difference voltages.

According to some example embodiments, a clock distribution circuit may include a phase locked loop (PLL), a first input phase-to-voltage converter (PVC), a first output phase-to-voltage converter, a first voltage-to-delay converter (VDC) and a second voltage-to-delay converter. The phase locked loop may generate a first reference clock signal and a second reference clock signal. The first input phase-to-voltage converter may generate a first input phase difference voltage based on a phase difference between the first reference clock signal and the second reference clock signal. The first output phase-to-voltage converter may generate a first output phase difference voltage based on a phase difference between a first power switching signal and a second power switching signal that are received from a first power switching node of a first external switching regulator and a second power switching node of a second external switching regulator, respectively, the first external switching regulator and the external second switching regulator being adjacent to each other. The first voltage-to-delay converter may generate a first reference voltage based on an input reference voltage, and generate a first input clock signal to be provided to the first external switching regulator by shifting a phase of the first reference clock signal based on the first reference voltage. The second voltage-to-delay converter may generate a second reference voltage based on the first reference voltage, generate a second input clock signal to be provided to the second external switching regulator by shifting a phase of the second reference clock signal based on the second reference voltage, and control a phase of the second input clock signal by adjusting a level of the second reference voltage based on the first input phase difference voltage and the first output phase difference voltage. The phase of the second input clock signal may be adjusted such that the phase difference between the first power switching signal and the second power switching signal is equal to the phase difference between the first reference clock signal and the second reference clock signal.

In the clock distribution circuits and the voltage converters according to some example embodiments, the phase differences between the plurality of reference clock signals associated with the inputs of the plurality of switching regulators may be detected, the phase differences between the plurality of power switching signals associated with the outputs of the plurality of switching regulators may be detected, and the phase of the at least one of the plurality of input clock signals may be compensated based on the two detection results. Accordingly, switching times of the plurality of switching regulators may be efficiently controlled or adjusted, a situation or condition in which all the switching regulators are simultaneously or concurrently supplying power may be mitigated or prevented, and thus the voltage converter may be implemented with a relatively small area and high resolution while reducing the input capacitance and the influence of EMI.

BRIEF DESCRIPTION OF THE DRAWINGS

Illustrative, non-limiting example embodiments will be more clearly understood from the following detailed description taken in conjunction with the accompanying drawings.

FIGS. 7A, 7B and 8 are diagrams for describing an operation of the clock distribution circuit of FIG. 6.

FIG. 13 is a flowchart illustrating a clock distribution method according to some example embodiments.

FIG. 14 is a block diagram illustrating an electronic system including a voltage converter according to some example embodiments.

DETAILED DESCRIPTION

Figure 1:
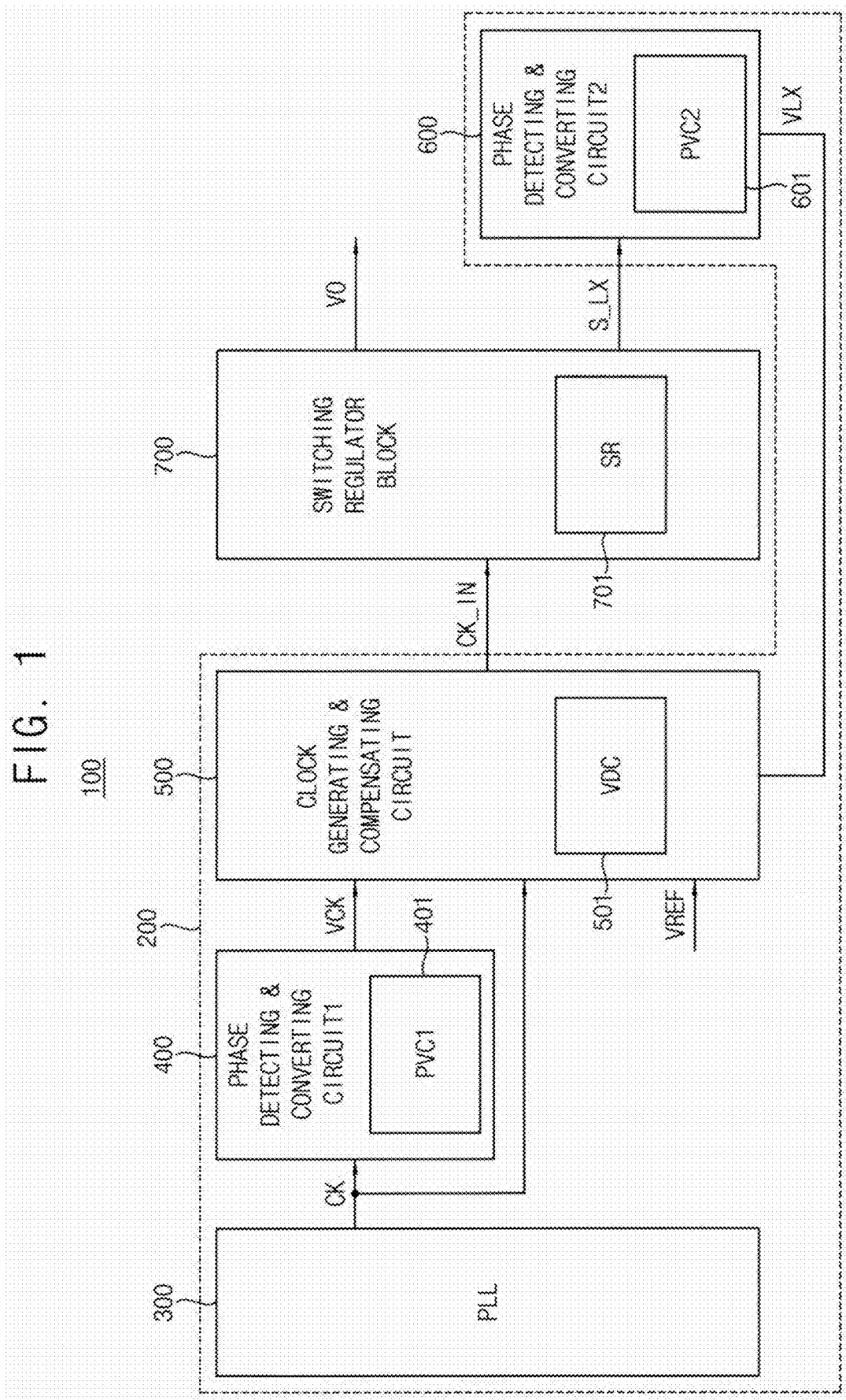
FIG. 1 is a block diagram illustrating a clock distribution circuit and a voltage converter including the clock distribution circuit according to some example embodiments.

Various example embodiments will be described more fully with reference to the accompanying drawings, in which the various example embodiments are shown. The present disclosure may, however, be embodied in many different forms and should not be construed as limited to the disclosed example embodiments set forth herein. Like reference numerals refer to like elements throughout this application.

While the term "same," "equal," or "identical" is used in the present disclosure, it should be understood that some imprecisions may exist. Thus, when one element is referred to as being the same as another element, it should be understood that an element or a value is the same as another element within a desired manufacturing or operational tolerance range (e.g., ±10%).

Likewise, when the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a block diagram illustrating a clock distribution circuit and a voltage converter including the clock distribution circuit according to some example embodiments.

Referring to FIG. 1, a voltage converter 100 includes a clock distribution circuit (CDC) 200 and a switching regulator block 700. For example, the voltage converter 100 may be a DC-DC converter.

The switching regulator block 700 generates a plurality of output voltages VO based on a plurality of input clock signals CK_IN. The switching regulator block 700 includes a plurality of switching regulators (SR) 701.

Each of the plurality of switching regulators 701 may generate a respective one of the plurality of output voltages VO based on a respective one of the plurality of input clock signals CK_IN. Each of the plurality of switching regulators 701 may include a power switching node, and one of a plurality of power switching signals S_LX may be output and/or fed back from the power switching node.

In some example embodiments, each of the plurality of switching regulators 701 may have a configuration corresponding to a buck converter that converts a relatively high direct current (DC) voltage into a relatively low DC voltage. In other example embodiments, each of the plurality of switching regulators 701 may have a configuration corresponding to a boost converter that converts a relatively low DC voltage into a relatively high DC voltage. In still other example embodiments, each of the plurality of switching regulators 701 may have a configuration corresponding to a buck-boost converter that converts an input DC voltage into a relatively high DC voltage and a relatively low DC voltage.

The clock distribution circuit 200 generates the plurality of input clock signals CK_IN provided to the switching regulator block 700 (e.g., to the plurality of switching regulators 701), and performs an adjustable (or adaptive) phase control operation for at least one of the plurality of input clock signals CK_IN. The clock distribution circuit 200 includes a phase locked loop (PLL) 300, a first phase detecting and converting circuit 400, a second phase detecting and converting circuit 600, and a clock generating and compensating circuit 500.

The phase locked loop 300 generates a plurality of reference clock signals CK. For example, the plurality of reference clock signals CK may have the same period and different phases. In other words, a desired (or alternatively, predetermined) phase difference may exist between any two reference clock signals among the plurality of reference clock signals CK. For example, when there are two reference clock signals, a phase difference between the two reference clock signals may be about 180 degrees.

The first phase detecting and converting circuit 400 may generate a plurality of input phase difference voltages (or a plurality of clock phase difference voltages) VCK based on phase differences (e.g., clock phase differences) between two reference clock signals among the plurality of reference clock signals CK. For example, the first phase detecting and converting circuit 400 may generates a plurality of input phase difference voltages (or a plurality of clock phase difference voltages) VCK by detecting phase differences (e.g., clock phase differences) between two reference clock signals among the plurality of reference clock signals CK.

The first phase detecting and converting circuit 400 includes a plurality of input phase-to-voltage converter (PVC) (PVC1) 401. Each of the plurality of input phase-to-voltage converters 401 may generate a respective one of the plurality of input phase difference voltages VCK based on (or by detecting and comparing) two of the plurality of reference clock signals CK. According to some example embodiments, the two reference clock signals input to each of the plurality of input phase-to-voltage converters 401 may be two reference clock signals adjacent to each other or two reference clock signals spaced apart from each other among the plurality of reference clock signals CK that are sequentially generated.

The second phase detecting and converting circuit 600 may generate a plurality of output phase difference voltages VLX (or a plurality of switching time difference voltages or a plurality of switching phase difference voltages) based on switching time differences or switching phase differences between two power switching signals among the plurality of power switching signals S_LX. For example, the second phase detecting and converting circuit 600 generates a plurality of output phase difference voltages VLX (or a plurality of switching time difference voltages or a plurality of switching phase difference voltages) by detecting phase differences (e.g., switching time differences or switching phase differences) between two power switching signals among the plurality of power switching signals S_LX. Each of the plurality of power switching signals S_LX is received from the power switching node included in each of the plurality of switching regulators 701.

The second phase detecting and converting circuit 600 includes a plurality of output phase-to-voltage converter (PVC2) 601. Each of the plurality of output phase-to-voltage converters 601 may generate a respective one of the plurality of output phase difference voltages VLX based on two of the plurality of power switching signals S_LX. According to some example embodiments, the two power switching signals input to each of the plurality of output phase-to-voltage converters 601 may be received from two switching regulators adjacent to each other or two switching regulators spaced apart from each other among the plurality of switching regulators 701 that are sequentially arranged.

The clock generating and compensating circuit 500 generates the plurality of input clock signals CK_IN by shifting phases of the plurality of reference clock signals CK, and additionally controls a phase of at least one of the plurality of input clock signals CK_IN based on the plurality of input phase difference voltages VCK and the plurality of output phase difference voltages VLX.

The clock generating and compensating circuit 500 includes a plurality of voltage-to-delay converters (VDC) 501. One of the plurality of voltage-to-delay converters 501 may be a reference voltage-to-delay converter (RVDC) that generates one of the plurality of input clock signals CK_IN by delaying one of the plurality of reference clock signals CK always by a fixed or constant phase based on an input reference voltage VREF. At least another one of the plurality of voltage-to-delay converters 501 may be an adjustable (or adaptive) voltage-to-delay converter (AVDC) that generates another one of the plurality of input clock signals CK_IN by adjusting a delay (or delay amount) of another one of the plurality of reference clock signals CK based on one of the plurality of input phase difference voltages VCK and one of the plurality of output phase difference voltages VLX.

In some example embodiments, when the number of the plurality of switching regulators 701 is n, where n is a natural number greater than or equal to two, the number of the plurality of output voltages VO, the number of the plurality of power switching signals S_LX, the number of the plurality of reference clock signals CK, the number of the plurality of voltage-to-delay converters 501, and the number of the plurality of input clock signals CK_IN may be n, respectively, and the number of the plurality of input phase-to-voltage converters 401, the number of the plurality of input phase difference voltages VCK, the number of the plurality of output phase-to-voltage converters 601, and the number of the plurality of output phase difference voltages VLX may be (n−1), respectively.

The clock distribution circuit 200 and the voltage converter 100 including the clock distribution circuit 200 according to some example embodiments perform the adjustable (or adaptive) phase control operation on at least one of the plurality of input clock signals CK_IN. For example, the phase differences between the plurality of reference clock signals CK associated with the inputs of the plurality of switching regulators 701 may be detected by the first phase detecting and converting circuit 400, the phase differences between the plurality of power switching signals S_LX associated with the outputs of the plurality of switching regulators 701 may be detected by the second phase detecting and converting circuit 600, and the phase of the at least one of the plurality of input clock signals CK_IN may be compensated based on the two detection results. Accordingly, switching times of the plurality of switching regulators 701 may be efficiently controlled or adjusted, a situation or condition in which all the switching regulators 701 are simultaneously or concurrently supplying power (e.g., a case in which input supplies are used at the same time) may be mitigated or prevented, and thus the voltage converter 100 may be implemented with a relatively small area and high resolution while reducing the input capacitance and the influence of electromagnetic interference (EMI).

Figure 2:
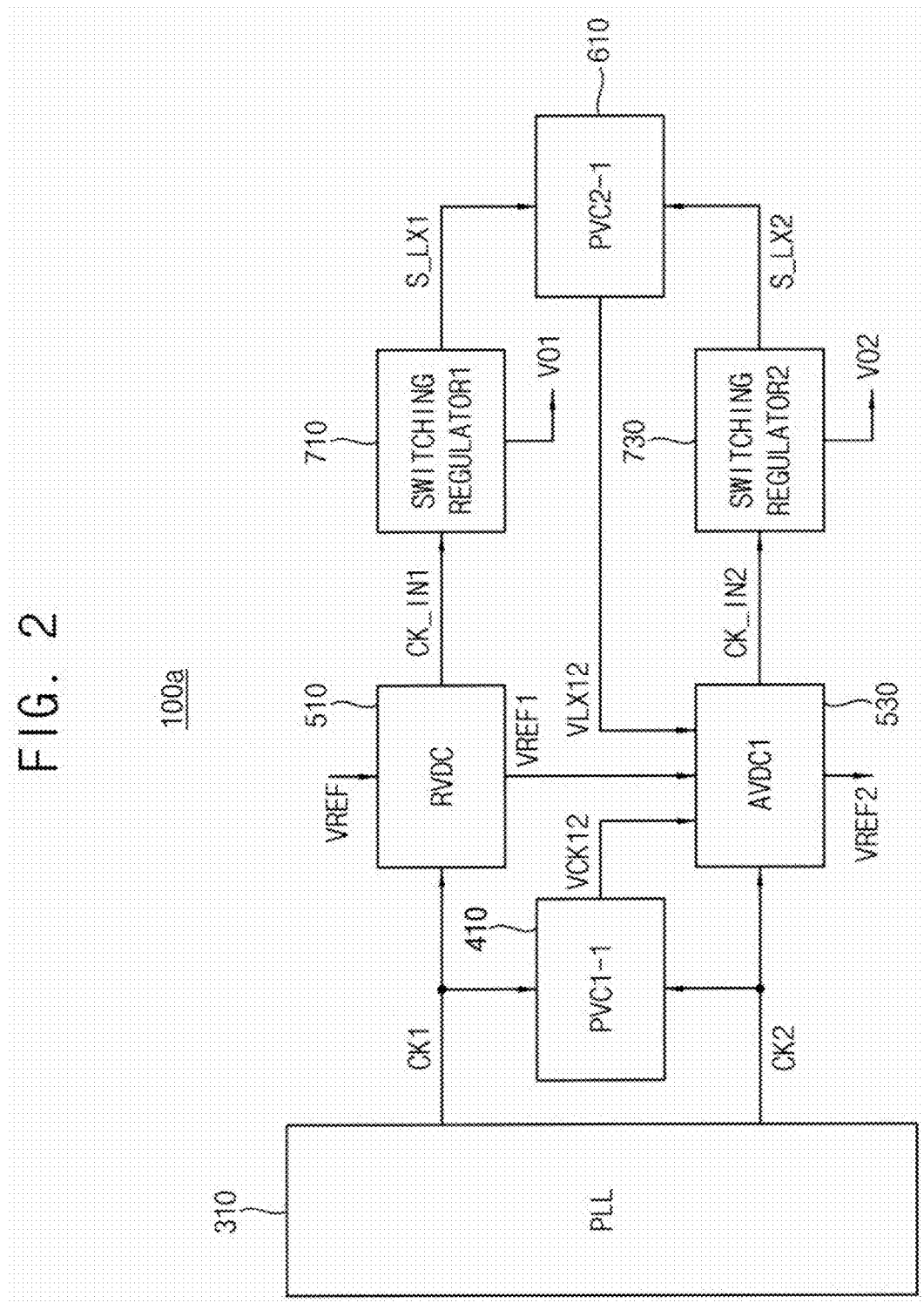
FIG. 2 is a block diagram illustrating an example of the clock distribution circuit and the voltage converter of FIG. 1.

FIG. 2 is a block diagram illustrating an example of the clock distribution circuit and the voltage converter of FIG. 1.

Referring to FIG. 2, a voltage converter 100a includes a phase locked loop 310, a first input phase-to-voltage converter (PVC1-1) 410, a first voltage-to-delay converter (RVDC) 510, a second voltage-to-delay converter (AVDC1) 530, a first output phase-to-voltage converter (PVC2-1) 610, a first switching regulator 710 and a second switching regulator 730.

The phase locked loop 310, the first input phase-to-voltage converter 410, the first and second voltage-to-delay converters 510 and 530, and the first output phase-to-voltage converter 610 may form the clock distribution circuit 200 in FIG. 1. The first and second switching regulators 710 and 730 may form the switching regulator block 700 in FIG. 1. FIG. 2 illustrates an example in which two switching regulators 710 and 730 are included in the voltage converter 100a, e.g., n=2 in FIG. 1.

Figure 3:
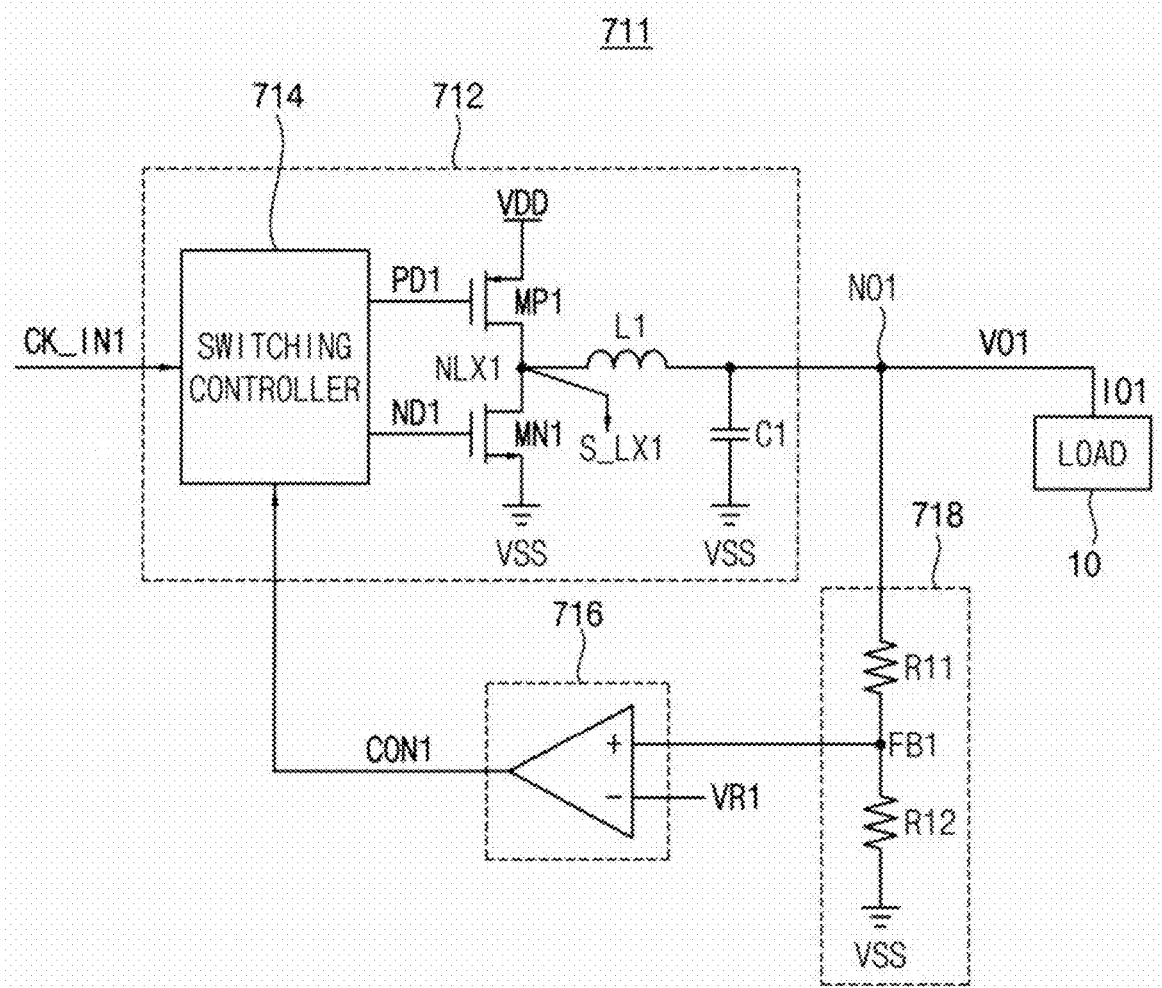
FIG. 3 is a circuit diagram illustrating an example of a first switching regulator included in the voltage converter of FIG. 2.

The first switching regulator 710 may generate a first output voltage VO1 based on a first input clock signal CK_IN1, and may include a first power switching node (e.g., a first power switching node NLX1 in FIG. 3). The second switching regulator 730 may generate a second output voltage VO2 based on a second input clock signal CK_IN2, and may include a second power switching node. A first power switching signal S_LX1 may be output from the first power switching node, and a second power switching signal S_LX2 may be output from the second power switching node.

The phase locked loop 310 may generate a first reference clock signal CK1 and a second reference clock signal CK2. For example, the first and second reference clock signals CK1 and CK2 may have a phase difference of about 180 degrees.

The first input phase-to-voltage converter 410 may generate a first input phase difference voltage VCK12 based on (e.g., by detecting) the phase difference between the first reference clock signal CK1 and the second reference clock signal CK2. The first output phase-to-voltage converter 610 may generate a first output phase difference voltage VLX12 based on (e.g., by detecting) a phase difference between the first power switching signal S_LX1 and the second power switching signal S_LX2.

The first voltage-to-delay converter 510 may generate a first reference voltage VREF1 based on the input reference voltage VREF, and may generate the first input clock signal CK_IN1 by shifting a phase of the first reference clock signal CK1 based on the first reference voltage VREF1. Each of the input reference voltage VREF and the first reference voltage VREF1 may always have a fixed level, and thus the first voltage-to-delay converter 510 may generate the first input clock signal CK_IN1 by delaying the first reference clock signal CK1 always by a fixed or constant phase. In other words, the first voltage-to-delay converter 510 may be a reference voltage-to-delay converter.

The second voltage-to-delay converter 530 may generate a second reference voltage VREF2 based on the first reference voltage VREF1, may generate the second input clock signal CK_IN2 by shifting a phase of the second reference clock signal CK2 based on the second reference voltage VREF2, and may additionally control a phase of the second input clock signal CK_IN2 by additionally adjusting a level of the second reference voltage VREF2 based on the first input phase difference voltage VCK12 and the first output phase difference voltage VLX12. The second reference voltage VREF2 may have a level that is changed or variable depending on the first input phase difference voltage VCK12 and the first output phase difference voltage VLX12, and thus the second voltage-to-delay converter 530 may generate the second input clock signal CK_IN2 by adjusting a delay (or delay amount) of the second reference clock signal CK2. In other words, the second voltage-to-delay converter 530 may be an adjustable (or adaptive) voltage-to-delay converter.

In some example embodiments, the first and second voltage-to-delay converters 510 and 530 may form the clock generating and compensating circuit 500 in FIG. 1, and the clock generating and compensating circuit in FIG. 2 (e.g., the first and second voltage-to-delay converters 510 and 530) may adjust a phase of one of the first and second input clock signals CK_IN1 and CK_IN2 based on the first input phase difference voltage VCK12 and the first output phase difference voltage VLX12 such that the phase difference between the first and second power switching signals S_LX1 and S_LX2 is substantially equal to or the same as the phase difference between the first and second reference clock signals CK1 and CK2 for generating the first and second input clock signals CK_IN1 and CK_IN2. Although FIG. 2 illustrates that the second voltage-to-delay converter 530 is implemented as an adjustable voltage-to-delay converter (e.g., a phase of a clock supplied to the second switching regulator 730 is adjusted), example embodiments are not limited thereto. In some example embodiments, the first voltage-to-delay converter 510 may be implemented as an adjustable voltage-to-delay converter.

The voltage converter 100a of FIG. 2 may operate as follows.

The first and second switching regulators 710 and 730 may use the first and second reference clock signals CK1 and CK2 generated from the phase locked loop 310, respectively. By the first input phase-to-voltage converter 410, the phase difference between the first and second reference clock signals CK1 and CK2 may be detected to generate the first input phase difference voltage VCK12. Similarly, by the first output phase-to-voltage converter 610, the phase difference between the first and second power switching signals S_LX1 and S_LX2, which are signals from the first and second power switching nodes of the first and second switching regulators 710 and 730, may be detected to generate first output phase difference voltage VLX12. Such detected voltages VCK12 and VLX12 may be provided to the second voltage-to-delay converter 530, and the second voltage-to-delay converter 530 may adjust the phase of the second reference clock signal CK2 based on the detected voltages VCK12 and VLX12 to generate the second input clock signal CK_IN2. The second input clock signal CK_IN2 may become a switching frequency of the second switching regulator 730 and may be used for tracking an intended (or desired) phase shift by the phase locked loop 310.

FIG. 3 is a circuit diagram illustrating an example of a first switching regulator included in the voltage converter of FIG. 2.

Referring to FIG. 3, a first switching regulator 711 may include a first voltage converting circuit 712, a first voltage control circuit 716 and a first feedback circuit 718.

The first voltage converting circuit 712 may convert an input voltage, e.g., a power supply voltage VDD, into a first output voltage VO1 based on the first input clock signal CK_IN1 and a first voltage control signal CON1. The first output voltage VO1 may be a voltage at a first output node NO1 and may be provided to a load 10 connected to the first output node NO1, and thus a first load current IO1 may be generated.

The first voltage converting circuit 712 may include a switching controller 714, a pull-up transistor MP1, a pull-down transistor MN1, an inductor L1 and a capacitor C1. For example, a configuration of the first voltage converting circuit 712 in FIG. 3 may correspond to a buck converter. However, example embodiments are not limited thereto, and the first voltage converting circuit 712 may have a configuration corresponding to a boost converter or a buck-boost converter, or may have one of various other configurations.

The switching controller 714 may generate a pull-up control signal PD1 and a pull-down control signal ND1 based on the first input clock signal CK_IN1 and the first voltage control signal CON1. When the pull-up control signal PD1 is activated at a low level, the pull-up transistor MP1 may be turned on to pull up a voltage of a first power switching node NLX1. When the pull-down control signal ND1 is activated at a high level, the pull-down transistor MN1 may be turned on to pull down the voltage of the first power switching node NLX1. For example, the pull-up transistor MP1 may be a p-type metal oxide semiconductor (PMOS) transistor, and the pull-down transistor MN1 may be an n-type metal oxide semiconductor (NMOS) transistor. The inductor L1 and the capacitor C1 may operate as a low pass filter (LPF), and may filter the voltage of the first power switching node NLX1 to provide the first output voltage VO1 to the first output node NO1. The first power switching signal S_LX1 may be output from the first power switching node NLX1. The configurations of the switching circuit including the pull-up transistor MP1 and the pull-down transistor MN1 and the low pass filter including the inductor L1 and the capacitor C1 may be variously modified according to some example embodiments.

The first voltage control circuit 716 may generate the first voltage control signal CON1 based on a feedback voltage FB1 proportional to the first output voltage VO1. The first voltage control circuit 716 may include an amplifier. The amplifier may include a first input terminal (e.g., a positive input terminal) receiving the feedback voltage FB1, a second input terminal (e.g., a negative input terminal) receiving a reference voltage VR1, and an output terminal outputting the first voltage control signal CON1.

The first feedback circuit 718 may generate the feedback voltage FB1 proportional to the first output voltage VO1. For example, as illustrated in FIG. 3, the first feedback circuit 718 may include distribution resistors R11 and R12, and may provide the feedback voltage FB1 corresponding to a ratio of resistances of the distribution resistors R11 and R12.

Although not illustrated in FIG. 3, the second switching regulator 730 may also have a configuration the same as or substantially similar to that illustrated in FIG. 3.

Figure 4:
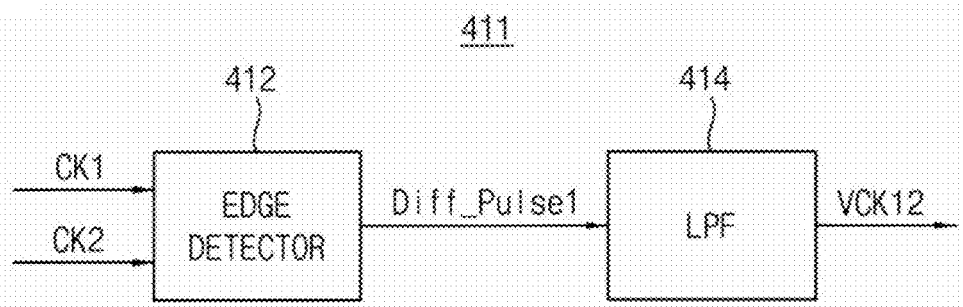
FIG. 4 is a block diagram illustrating an example of a first input phase-to-voltage converter included in the clock distribution circuit of FIG. 2.

FIG. 4 is a block diagram illustrating an example of a first input phase-to-voltage converter included in the clock distribution circuit of FIG. 2.

Referring to FIG. 4, a first input phase-to-voltage converter 411 may include a first edge detector 412 and a first low pass filter 414.

The first edge detector 412 may generate a first phase difference pulse signal Diff_Pulse1 based on (e.g., by detecting) edges of the first reference clock signal CK1 and the second reference clock signal CK2 (e.g., by detecting the phase difference between the first reference clock signal CK1 and the second reference clock signal CK2).

The first low pass filter 414 may convert the first phase difference pulse signal Diff_Pulse1 into the first input phase difference voltage VCK12 (e.g., may output the first input phase difference voltage VCK12 by filtering the first phase difference pulse signal Diff_Pulse1).

In some example embodiments, as the phase difference between the first reference clock signal CK1 and the second reference clock signal CK2 increases, a level (e.g., a voltage level or a magnitude of a voltage) of the first input phase difference voltage VCK12 may increase, and as the phase difference between the first reference clock signal CK1 and the second reference clock signal CK2 decreases, the level of the first input phase difference voltage VCK12 may decrease.

Although not illustrated in FIG. 4, the first output phase-to-voltage converter 610 may have a configuration the same as or substantially similar to that illustrated in FIG. 4.

Figure 5:
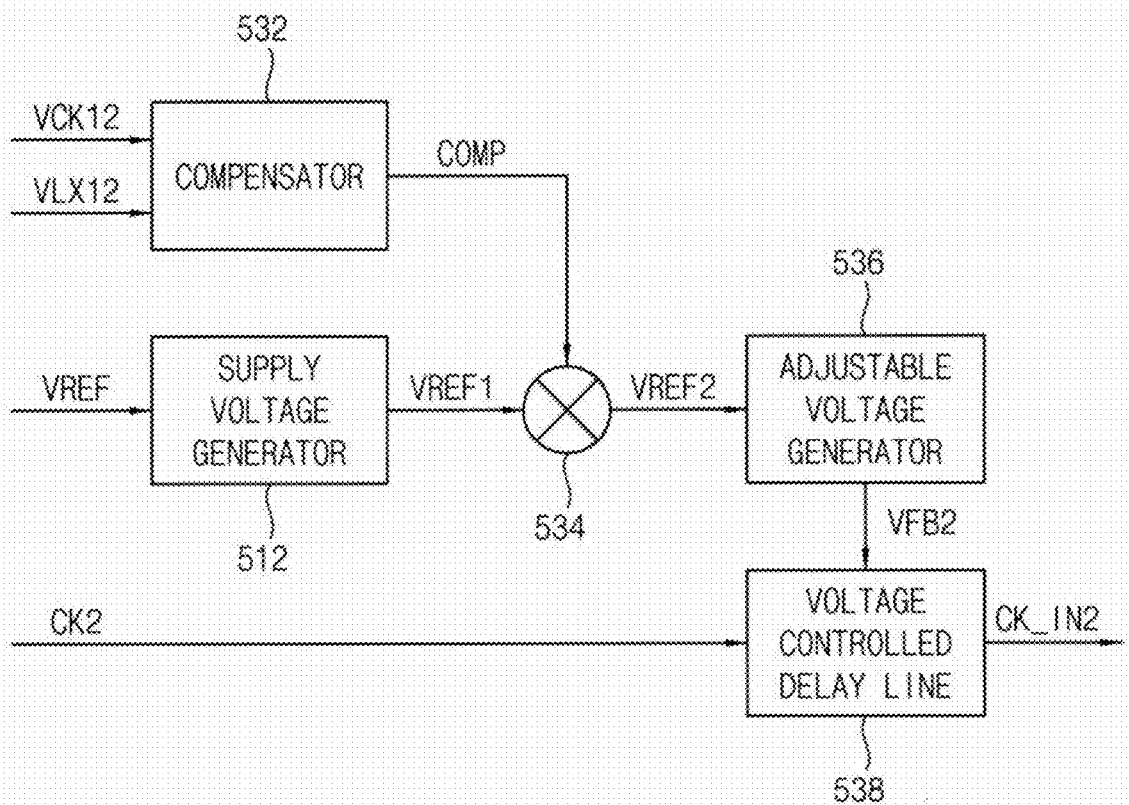
FIG. 5 is a diagram for conceptually describing an operation of a clock generating and compensating circuit included in the clock distribution circuit of FIG. 2.

FIG. 5 is a diagram for conceptually describing an operation of a clock generating and compensating circuit included in the clock distribution circuit of FIG. 2.

Referring to FIG. 5, a supply voltage generator 512 may generate the first reference voltage VREF1 based on the input reference voltage VREF.

A compensator 532 may generate a compensation signal COMP for adjusting the phase of the second input clock signal CK_IN2 based on the first input phase difference voltage VCK12 and the first output phase difference voltage VLX12. As described above, the first input phase difference voltage VCK12 may be a voltage that is obtained based on (e.g., by detecting) the phase difference between the first and second reference clock signals CK1 and CK2 used by the first and second switching regulators 710 and 730, and the first output phase difference voltage VLX12 may be a voltage that is obtained based on (e.g., by detecting) the phase difference occurring between the first and second power switching nodes of the first and second switching regulators 710 and 730.

A mixer 534 may generate the second reference voltage VREF2 based on the first reference voltage VREF1 and the compensation signal COMP. An adjustable voltage generator 536 may generate a feedback voltage VFB2 for controlling a voltage controlled delay line 538 based on the second reference voltage VREF2. The voltage controlled delay line 538 may adjust the phase of the second input clock signal CK_IN2 based on the feedback voltage VFB2. Thus, the switching phase difference between the first and second switching regulators 710 and 730 may be substantially equal to or the same as the clock phase difference intended or desired by the phase locked loop 310.

The supply voltage generator 512 may correspond to some components in the first voltage-to-delay converter 510. The compensator 532, the mixer 534, the adjustable voltage generator 536 and the voltage controlled delay line 538 may correspond to components in the second voltage-to-delay converter 530.

Figure 6:
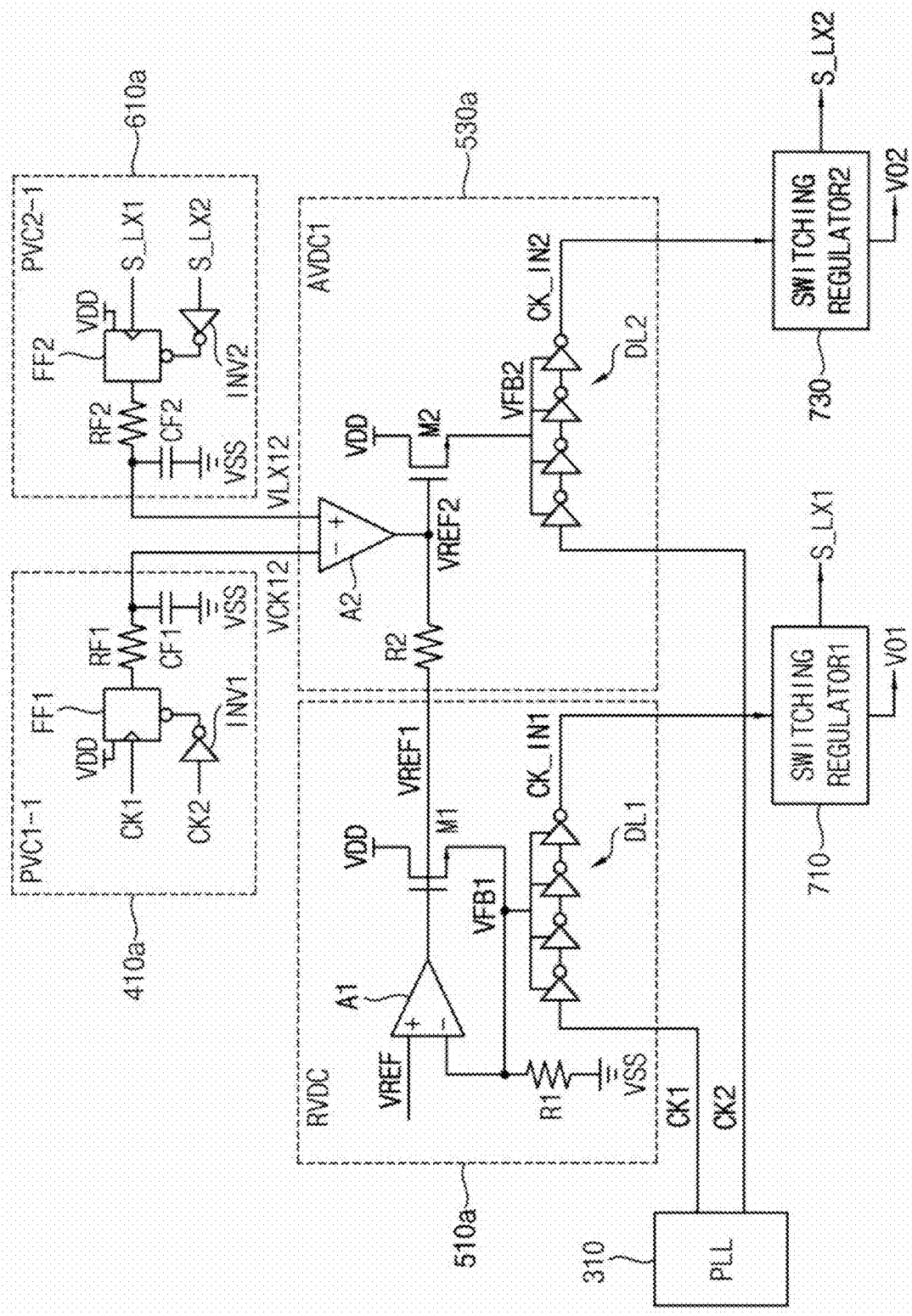
FIG. 6 is a circuit diagram illustrating a detailed example of the clock distribution circuit and the voltage converter of FIG. 2.

FIG. 6 is a circuit diagram illustrating a detailed example of the clock distribution circuit and the voltage converter of FIG. 2.

Referring to FIG. 6, a voltage converter includes the phase locked loop 310, a first input phase-to-voltage converter 410a, a first voltage-to-delay converter 510a, a second voltage-to-delay converter 530a, a first output phase-to-voltage converter 610a, the first switching regulator 710 and the second switching regulator 730.

A configuration of the phase locked loop 310 is widely known to those skilled in the art, configurations of the first and second switching regulators 710 and 730 are the same as or substantially similar to that described with reference to FIG. 3, and thus detailed configurations of the phase locked loop 310 and the first and second switching regulators 710 and 730 are omitted in FIG. 6, for convenience of illustration.

The first input phase-to-voltage converter 410a may include a flip-flop FF1, a resistor RF1 and a capacitor CF1, and may further include an inverter INV1.

The flip-flop FF1 may generate a first phase difference pulse signal (e.g., a first phase difference pulse signal Diff_Pulse1 in FIGS. 7A and 7B) based on the power supply voltage VDD, the first reference clock signal CK1 and the second reference clock signal CK2. For example, the flip-flop FF1 may be a D-flip-flop. For example, the flip-flop FF1 may include a data input terminal receiving the power supply voltage VDD, a clock input terminal receiving the first reference clock signal CK1, an inversion input terminal receiving the second reference clock signal CK2 through the inverter INV1, and an output terminal outputting the first phase difference pulse signal Diff_Pulse1. The flip-flop FF1 may have a configuration corresponding to the first edge detector 412 in FIG. 4.

The resistor RF1 may include a first electrode connected to the output terminal of the flip-flop FF1 to receive the first phase difference pulse signal Diff_Pulse1, and a second electrode connected to a node outputting the first input phase difference voltage VCK12. The capacitor CF1 may be connected between the second electrode of the resistor RF1 and a ground voltage VSS. The resistor RF1 and the capacitor CF1 may have a configuration corresponding to the first low pass filter 414 in FIG. 4.

The first output phase-to-voltage converter 610a may include a flip-flop FF2, a resistor RF2 and a capacitor CF2, and may further include an inverter INV2. The first output phase-to-voltage converter 610a may have a configuration the same as or substantially similar to that of the first input phase-to-voltage converter 410a.

The flip-flop FF2 may generate a second phase difference pulse signal (e.g., a second phase difference pulse signal Diff_Pulse2 in FIGS. 7A and 7B) based on the power voltage VDD, the first power switching signal S_LX1 and the second power switching signal S_LX2. The resistor RF2 may include a first electrode receiving the second phase difference pulse signal Diff_Pulse2, and a second electrode connected to a node outputting the first output phase difference voltage VLX12. The capacitor CF2 may be connected between the second electrode of the resistor RF2 and the ground voltage VSS. The flip-flop FF2 may form a second edge detector included in the first output phase-to-voltage converter 610a, and the resistor RF2 and the capacitor CF2 may form a second low pass filter included in the first output phase-to-voltage converter 610a.

The first voltage-to-delay converter 510a may include an amplifier A1, a transistor M1 and a delay line DL1, and may further include a resistor R1.

The amplifier A1 may include a first input terminal (e.g., a positive input terminal) receiving the input reference voltage VREF, a second input terminal (e.g., a negative input terminal) connected to the first resistor R1, and an output terminal outputting the first reference voltage VREF1. The transistor M1 may include a first electrode receiving the power supply voltage VDD, a control (or gate) electrode receiving the first reference voltage VREF1, and a second electrode outputting a feedback voltage VFB1. For example, the transistor M1 may be an NMOS transistor. The delay line DL1 may generate the first input clock signal CK_IN1 by delaying the phase of the first reference clock signal CK1 based on the feedback voltage VFB1. For example, the delay line DL1 may include a plurality of inverters connected in series, and the feedback voltage VFB1 may be used as a driving voltage of the plurality of inverters.

The second voltage-to-delay converter 530a may include a resistor R2, an amplifier A2, a transistor M2 and a delay line DL2.

The resistor R2 may include a first electrode receiving the first reference voltage VREF1, and a second electrode connected to a node outputting the second reference voltage VREF2 (e.g., an output terminal of the amplifier A2). The amplifier A2 may include a first input terminal (e.g., a negative input terminal) receiving the first input phase difference voltage VCK12, a second input terminal (e.g., a positive input terminal) receiving the first output phase difference voltage VLX12, and an output terminal connected to the node outputting the second reference voltage VREF2 (e.g., the second electrode of the resistor R2). The transistor M2 may include a first electrode receiving the power supply voltage VDD, a control (or gate) electrode receiving the second reference voltage VREF2, and a second electrode outputting a feedback voltage VFB2. For example, the transistor M2 may be an NMOS transistor. The delay line DL2 may generate the second input clock signal CK_IN2 by delaying the phase of the second reference clock signal CK2 based on the feedback voltage VFB2. For example, the delay line DL2 may include a plurality of inverters connected in series, and the feedback voltage VFB2 may be used as a driving voltage of the plurality of inverters.

The amplifier A1 included in the first voltage-to-delay converter 510a may be a configuration corresponding to the supply voltage generator 512 in FIG. 5. The resistor R2, the amplifier A2, the transistor M2 and the delay line DL2 included in the second voltage-to-delay converter 530a may be configurations corresponding to the mixer 534, the compensator 532, the adjustable voltage generator 536 and the voltage controlled delay line 538 in FIG. 5, respectively.

The voltage converter of FIG. 6 may operate as follows.

First, the first reference clock signal CK1 provided from the phase locked loop 310 may be delayed by the delay line DL1 included in the first voltage-to-delay converter 510a to be output as the first input clock signal CK_IN1. A delay time by the delay line DL1 may be proportional to the feedback voltage VFB1, and may be proportional to the input reference voltage VREF because the feedback voltage VFB1 is generated based on the input reference voltage VREF and the first reference voltage VREF1. The first input clock signal CK_IN1 generated by the above-described manner may be used as a switching clock of the first switching regulator 710.

Similarly, the second reference clock signal CK2 provided from the phase locked loop 310 may be delayed by the delay line DL2 included in the second voltage-to-delay converter 530a to be output as the second input clock signal CK_IN2. A delay time by the delay line DL2 may be proportional to the feedback voltage VFB2, and may be proportional to the second reference voltage VREF2 because the feedback voltage VFB2 is generated based on the second reference voltage VREF2. The second input clock signal CK_IN2 generated by the above-described manner may be used as a switching clock of the second switching regulator 730.

Each of the input reference voltage VREF and the first reference voltage VREF1 used in the first voltage-to-delay converter 510a may always have a fixed level, and thus the delay time by the delay line DL1 may always be fixed or constant. On the other hand, the second reference voltage VREF2 used in the second voltage-to-delay converter 530*a* may have a variable level, and thus the delay time by the delay line DL2 may also be variable or changed. For example, the second reference voltage VREF2 may be generated by comparing the phase difference between the first and second reference clock signals CK1 and CK2 and the phase difference between the first and second power switching signals S_LX1 and S_LX2. Thus, the level of the second reference voltage VREF2 may be changed depending on the comparison result.

For example, if a switching time interval between the first and second switching regulators 710 and 730 is smaller than the amount of phase shift between the first and second reference clock signals CK1 and CK2 generated by the phase locked loop 310 (e.g., when the phase difference between the first and second power switching signals S_LX1 and S_LX2 is smaller than the phase difference of the first and second reference clock signals CK1 and CK2), the level of the first output phase difference voltage VLX12, which is a voltage output through the resistor RF2, may decrease, and thus the level of the second reference voltage VREF2 and the level of the feedback voltage VFB2 may also decrease. The feedback voltage VFB2 may be used as the driving voltage (e.g., a power supply voltage) of the delay line DL2 including the plurality of inverters. Because the delay time of the delay line DL2 is inversely proportional to the level of the driving voltage, the delay time of the delay line DL2 may increase as the level of the feedback voltage VFB2 decreases. Therefore, a delay time of the second input clock signal CK_IN2 may increase due to the reduced feedback voltage VFB2, and the phase difference or time interval between the first and second power switching signals S_LX1 and S_LX2 may increase. In the opposite case, the level of the feedback voltage (VFB2) may increase, the delay time of the second input clock signal CK_IN2 may decrease, and thus the phase difference or time interval between the first and second power switching signals S_LX1 and S_LX2 may decrease.

Figure 7B:
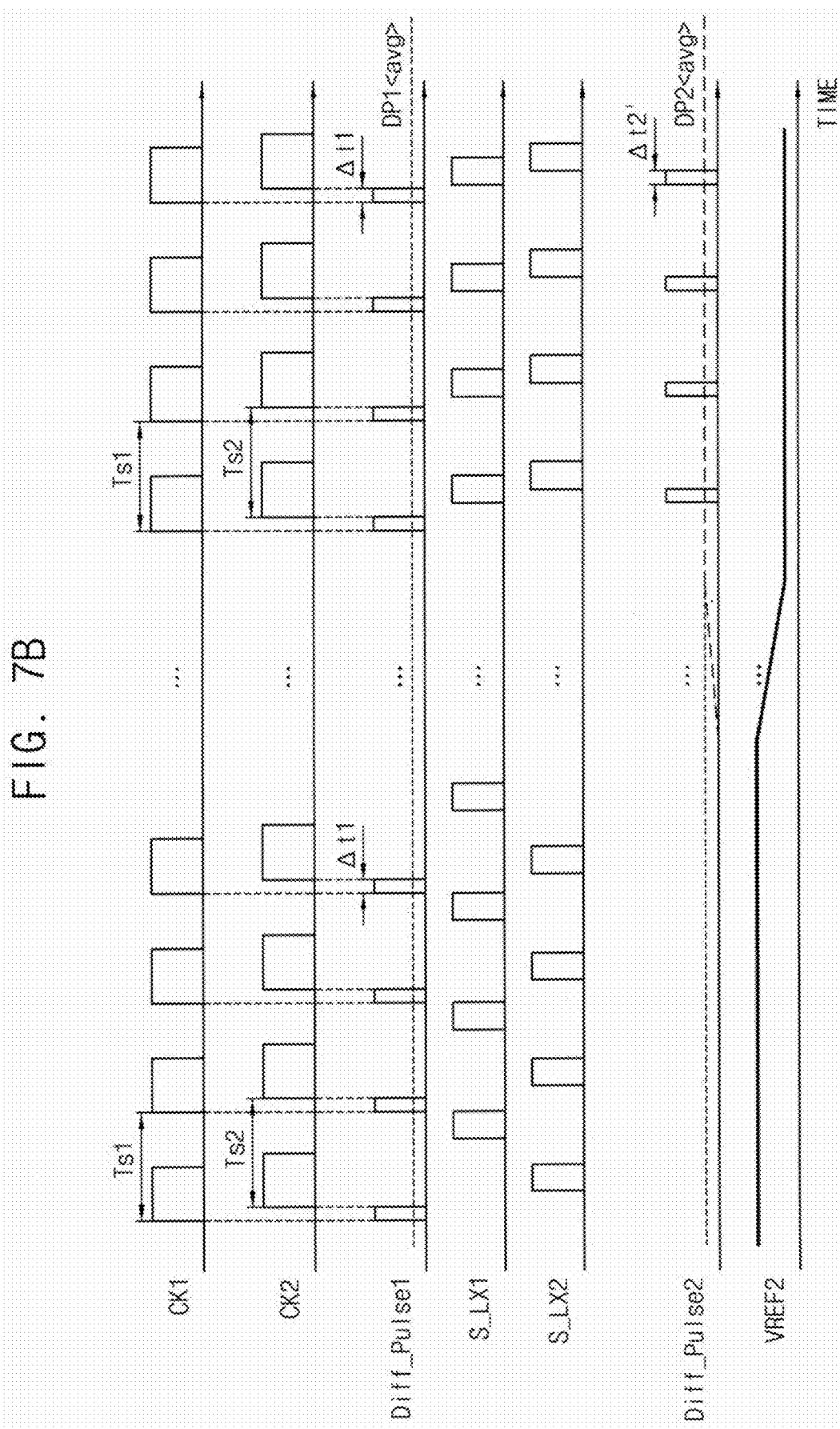
Figure 8:
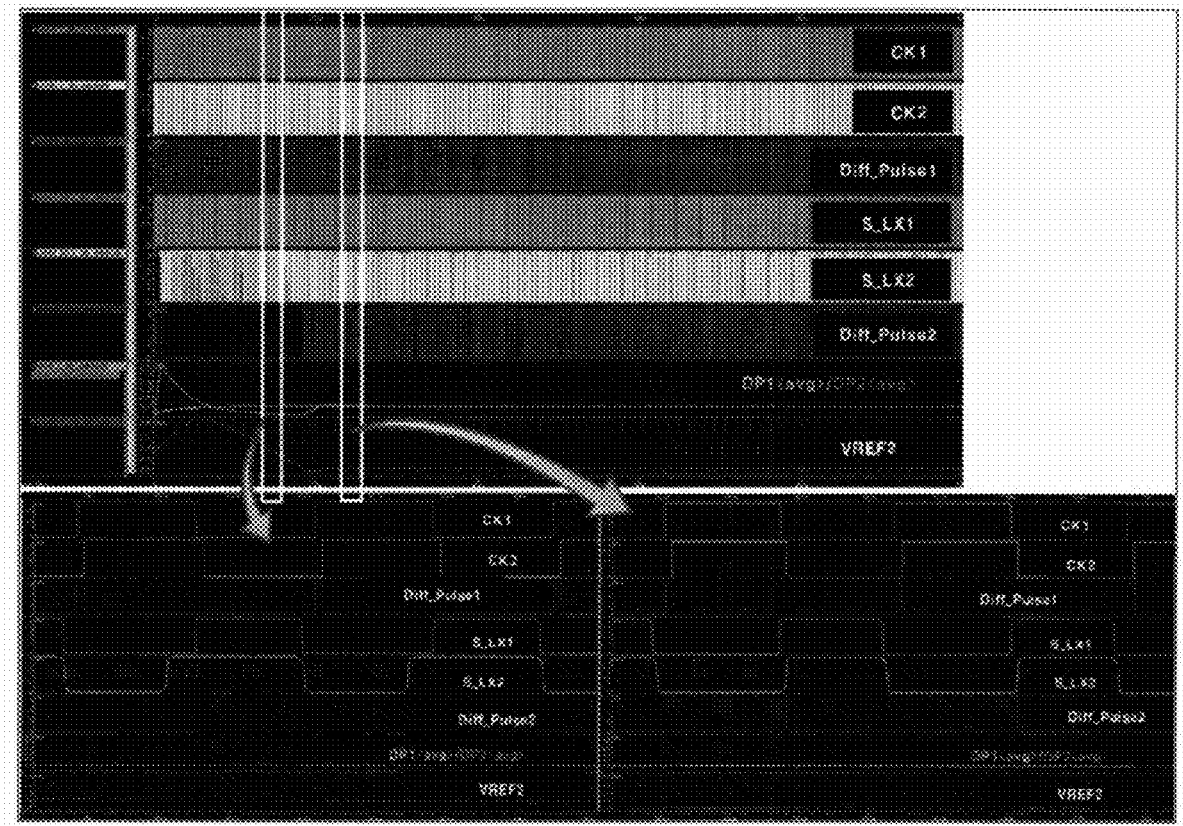

FIGS. 7A, 7B and 8 are diagrams for describing an operation of the clock distribution circuit of FIG. 6.

In FIGS. 7A, 7B and 8, periods of the first and second reference clock signals CK1 and CK2 may be Ts1 and Ts2, respectively. The first and second reference clock signals CK1 and CK2 may have the same period and a duty ratio of about 50:50. The first phase difference pulse signal Diff_Pulse1 may be output from the flip-flop FF1 and may represent the phase difference between the first and second reference clock signals CK1 and CK2. The second phase difference pulse signal Diff_Pulse2 may be output from the flip-flop FF2 and may represent the phase difference between the first and second power switching signals S_LX1 and S_LX2. DP1<avg> and DP2<avg> may represent DC average values, which are results of performing the low pass filtering on the first phase difference pulse signal Diff_Pulse1 and the second phase difference pulse signal Diff_Pulse2, respectively. DP1<avg> and DP2<avg> may correspond to the first input phase difference voltage VCK12 and the first output phase difference voltage VLX12, respectively.

FIG. 7A illustrates an operation of the adjustable phase control when the switching time interval between the first and second switching regulators 710 and 730 becomes longer than the intended phase shift (e.g., when a phase difference Δt2 between the first and second power switching signals S_LX1 and S_LX2 is greater than a phase difference Δt1 between the first and second reference clock signals CK1 and CK2).

In the example of FIG. 7A, in an initial operation time, the switching time interval between the first and second switching regulators 710 and 730 is relatively long, and a voltage level of DP2<avg> is set relatively high. By performing the adjustable phase control operation according to some example embodiments, the voltage level of DP2<avg> may decrease, the level of the second reference voltage VREF2 may increase, the level of the feedback voltage VFB2 may increase, the delay time of the delay line DL2 may decrease, the delay time of the second input clock signal CK_IN2 may decrease, and the switching time interval between the first and second switching regulators 710 and 730 may decrease. Finally, a phase difference Δt2' between the first and second power switching signals S_LX1 and S_LX2 may become substantially equal to the same as the phase difference Δt1 between the first and second reference clock signals CK1 and CK2.

FIG. 7B illustrates an operation of the adjustable phase control when the switching time interval between the first and second switching regulators 710 and 730 becomes shorter than the intended phase shift (e.g., when a phase difference between the first and second power switching signals S_LX1 and S_LX2 is smaller than a phase difference Δt1 between the first and second reference clock signals CK1 and CK2).

In the example of FIG. 7B, in an initial operation time, the switching time interval between the first and second switching regulators 710 and 730 is relatively short, and the voltage level of DP2<avg> is set relatively low. For example, although the phase of the first reference clock signal CK leads (or is ahead of) the phase of the second reference clock signal CK2, the phase of the first power switching signal S_LX1 lags (e.g., is later than) the phase of the second power switching signal S_LX2, unlike the intended, and thus the voltage level of DP2<avg> may be set to about zero. By performing the adjustable phase control operation according to some example embodiments, the voltage level of DP2<avg> may increase, the level of the second reference voltage VREF2 may decrease, the level of the feedback voltage VFB2 may decrease, the delay time of the delay line DL2 may increase, the delay time of the second input clock signal CK_IN2 may increase, and the switching time interval between the first and second switching regulators 710 and 730 may increase. Finally, a phase difference Δt2' between the first and second power switching signals S_LX1 and S_LX2 may become substantially equal to the same as the phase difference Δt1 between the first and second reference clock signals CK1 and CK2.

Referring to FIG. 8, a simulation result for the example of FIG. 7B is illustrated. Two graphs at the bottom are obtained by enlarging or zooming in partial regions of a graph at the top. The bottom left graph corresponds to the initial operation time in FIG. 7B, and the bottom right graph corresponds to the operation time after the adjustable phase control operation in FIG. 7B is completed.

In the clock distribution circuit and the voltage converter according to some example embodiments, the clock phase shift may be compensated based on (e.g., by detecting) the phase difference between the input clocks and the switching phase difference between the switching regulators through the negative feedback loop. Accordingly, the problem of simultaneous switching due to internal delay caused by the variable clock frequency from the phase locked loop may be remedied, and the input capacitance and the influence of EMI of the PMIC chip may be reduced. In addition, the clock phase difference caused by the changes in process, voltage and temperature, the internal parasitic elements, etc. may be efficiently controlled or adjusted.

Figure 9:
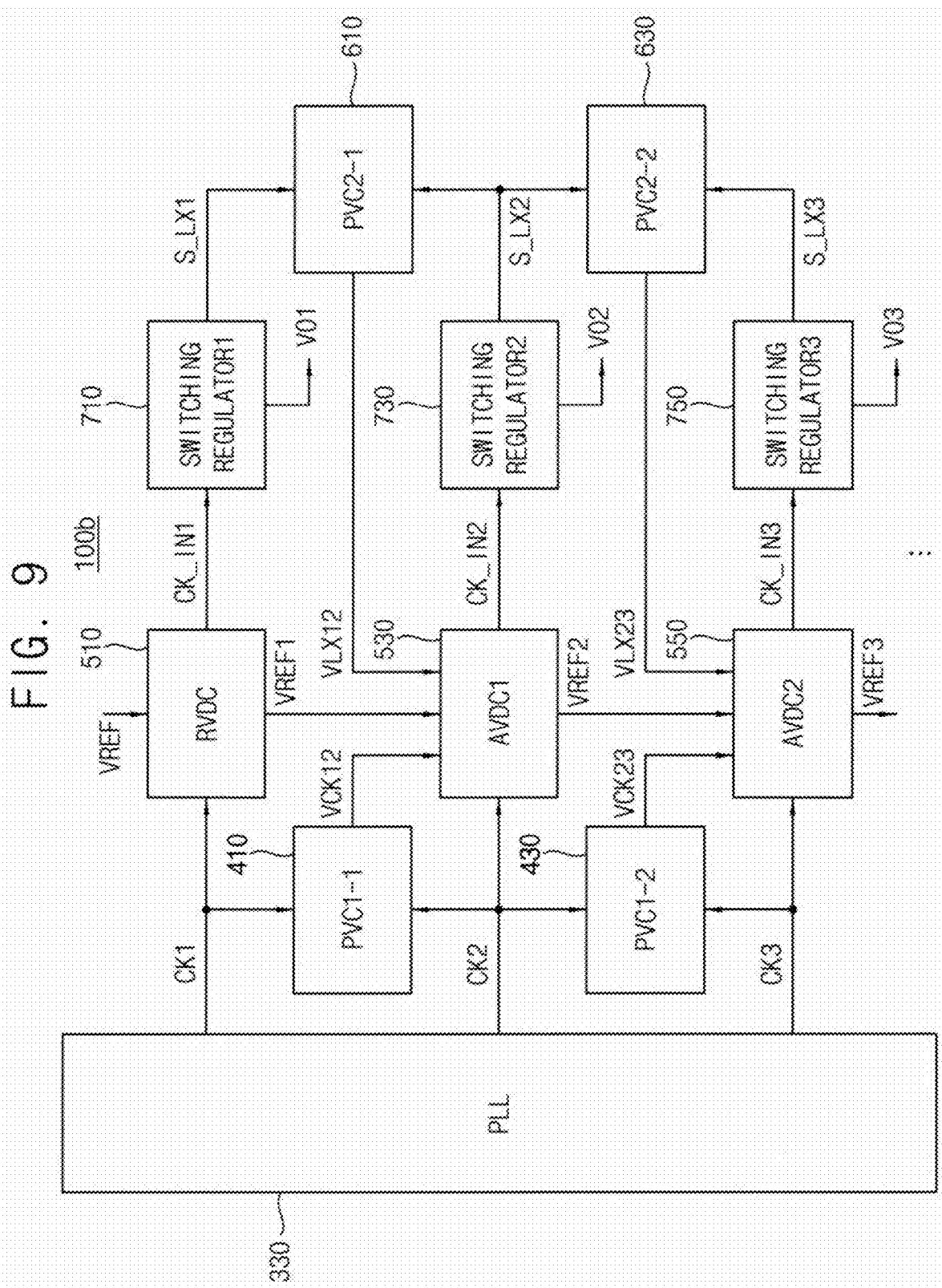
FIG. 9 is a block diagram illustrating another example of the clock distribution circuit and the voltage converter of FIG. 1.

FIG. 9 is a block diagram illustrating another example of the clock distribution circuit and the voltage converter of FIG. 1. Some elements are described with reference to FIG. 2, and thus descriptions thereof will not be repeated here.

Referring to FIG. 9, a voltage converter 100b includes a phase locked loop 330, a first input phase-to-voltage converter 410, a second input phase-to-voltage converter (PVC1-2) 430, a first voltage-to-delay converter 510, a second voltage-to-delay converter 530, a third voltage-to-delay converter (AVDC2) 550, a first output phase-to-voltage converter 610, a second output phase-to-voltage converter (PVC2-2) 630, a first switching regulator 710, a second switching regulator 730 and a third switching regulator 750.

The voltage converter 100b of FIG. 9 may be the same as or substantially similar to the voltage converter 100a of FIG. 2, except that the voltage converter 100b further includes the second input phase-to-voltage converter 430, the third voltage-to-delay converter 550, the second output phase-to-voltage converter 630 and the third switching regulator 750. FIG. 9 illustrates an example in which three switching regulators 710, 730 and 750 are included in the voltage converter 100b, e.g., n=3 in FIG. 1.

The third switching regulator 750 may generate a third output voltage VO3 based on a third input clock signal CK_IN3, and may include a third power switching node. A third power switching signal S_LX3 may be output from the third power switching node. The third switching regulator 750 may have a configuration the same as or substantially similar to that illustrated in FIG. 3.

The phase locked loop 330 may generate a first reference clock signal CK1, a second reference clock signal CK2 and a third reference clock signal CK3. For example, two adjacent clock signals among the first, second and third reference clock signals CK1, CK2 and CK3 may have a phase difference of about 120 degrees.

The second input phase-to-voltage converter 430 may generate a second input phase difference voltage VCK23 based on (e.g., by detecting) a phase difference between the second reference clock signal CK2 and the third reference clock signal CK3. The second output phase-to-voltage converter 630 may generate a second output phase difference voltage VLX23 based on (e.g., by detecting) a phase difference between the second power switching signal S_LX2 and the third power switching signal S_LX3. Each of the second input phase-to-voltage converter 430 and the second output phase-to-voltage converter 630 may have a configuration the same as or substantially similar to that illustrated in FIG. 4.

The third voltage-to-delay converter 550 may generate a third reference voltage VREF3 based on the second reference voltage VREF2, may generate the third input clock signal CK_IN3 by shifting a phase of the third reference clock signal CK3 based on the third reference voltage VREF3, and may additionally control a phase of the third input clock signal CK_IN3 by additionally adjusting a level of the third reference voltage VREF3 based on the second input phase difference voltage VCK23 and the second output phase difference voltage VLX23. The third reference voltage VREF3 may have a level that is changed or variable depending on the second input phase difference voltage VCK23 and the second output phase difference voltage VLX23, and thus the third voltage-to-delay converter 550 may generate the third input clock signal CK_IN3 by adjusting a delay (or delay amount) of the third reference clock signal CK3. The third voltage-to-delay converter 550 may have a configuration the same as or substantially similar to that of the second voltage-to-delay converter 530.

In some example embodiments, the clock distribution circuit included in the voltage converter 100b may perform an adjustable phase control operation by comparing inputs and outputs of two switching regulators adjacent to each other among the switching regulators 710, 730 and 750 with each other. For example, the second voltage-to-delay converter 530 may perform the adjustable phase control operation associated with or with respect to the first and second switching regulators 710 and 730 disposed or arranged adjacent to each other, and the third voltage-to-delay converter 550 may perform the adjustable phase control operation associated with or with respect to the second and third switching regulators 730 and 750 disposed or arranged adjacent to each other. As described above, a scheme of comparing clocks and switching nodes between switching regulators operating based on adjacent clocks may be referred to as a direct sensing scheme.

Although FIG. 9 illustrates the example where the voltage converter 100b includes three switching regulators 710, 730 and 750 and is implemented with the direct sensing scheme, example embodiments are not limited thereto. For example, the voltage converter 100b may further include a third input phase-to-voltage converter, a fourth voltage-to-delay converter, a third output phase-to-voltage converter and a fourth switching regulator, and the fourth voltage-to-delay converter may perform the adjustable phase control operation associated with the third and fourth switching regulators disposed adjacent to each other based on the direct sensing scheme.

Figure 10A:
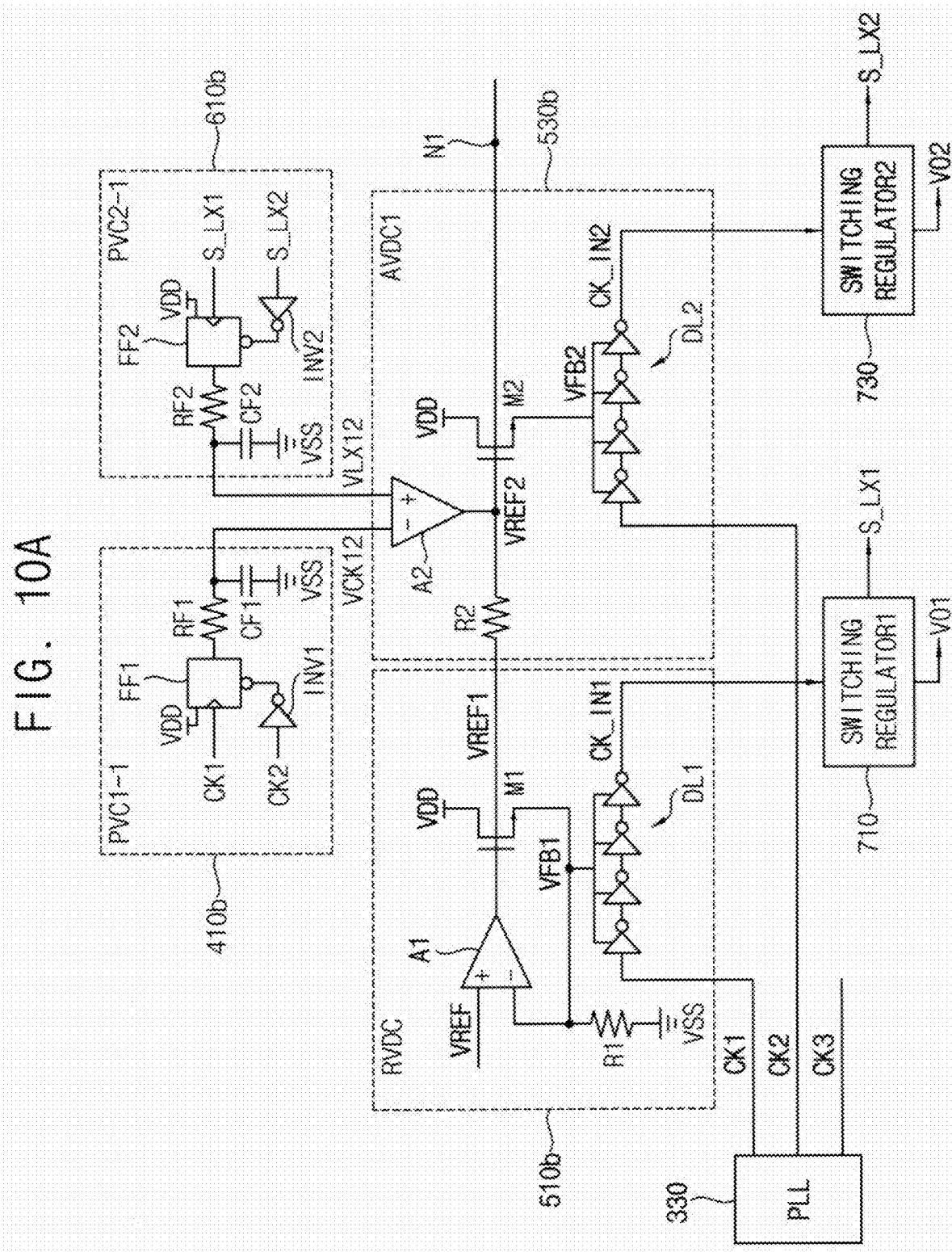
FIGS. 10A and 10B are circuit diagrams illustrating a detailed example of the clock distribution circuit and the voltage converter of FIG. 9.
Figure 10B:
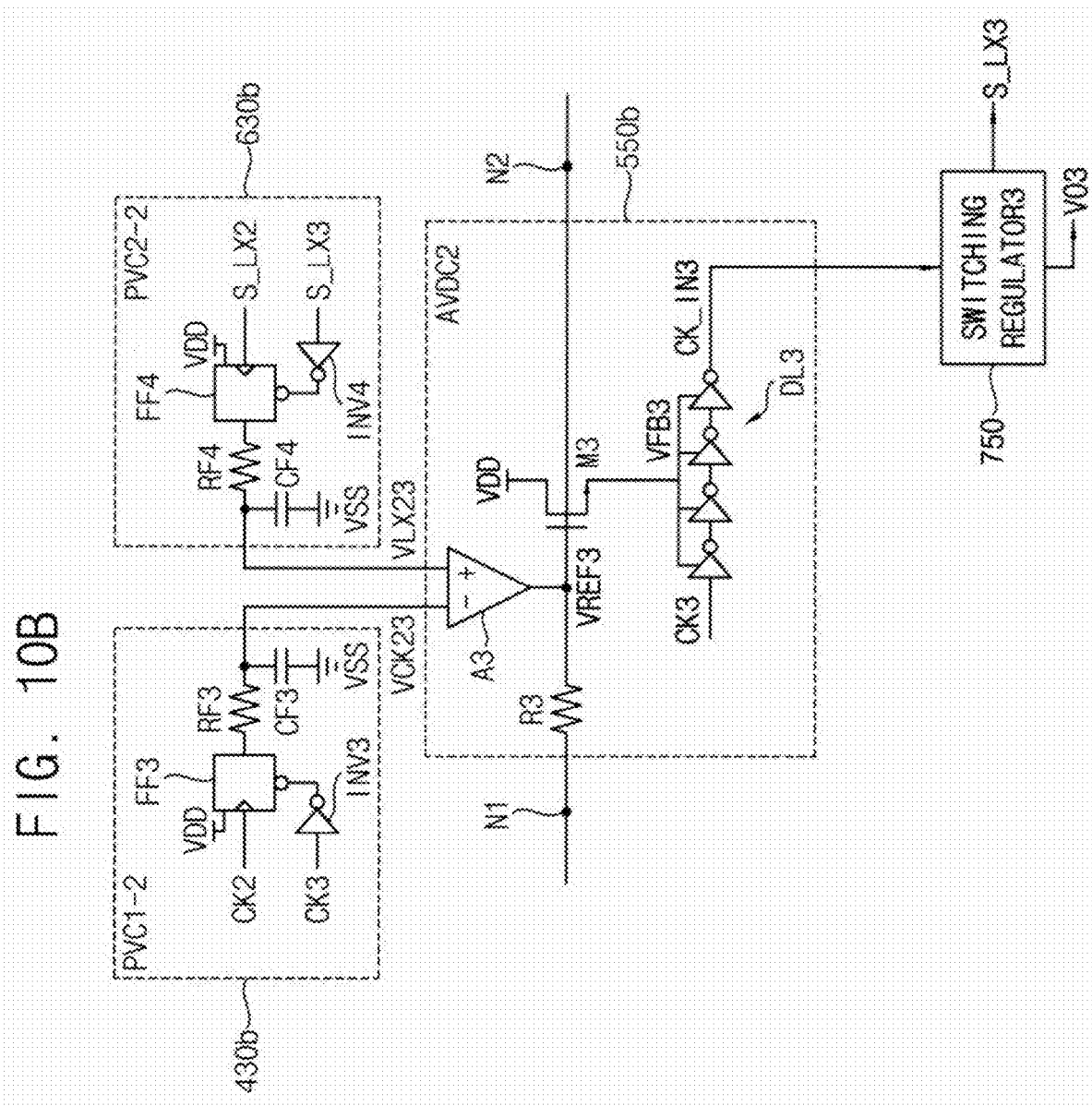

FIGS. 10A and 10B are circuit diagrams illustrating a detailed example of the clock distribution circuit and the voltage converter of FIG. 9. Some elements of FIGS. 10A and 10B are described with reference to FIG. 6, and thus descriptions thereof will not be repeated here.

Referring to FIGS. 10A and 10B, a first input phase-to-voltage converter 410b, a first voltage-to-delay converter 510b, a second voltage-to-delay converter 530b and a first output phase-to-voltage converter 610b in FIG. 10A may be the same as or substantially similar to the first input phase-to-voltage converter 410a, the first voltage-to-delay converter 510a, the second voltage-to-delay converter 530a and the first output phase-to-voltage converter 610a in FIG. 6, respectively. Detailed configurations of the phase locked loop 330 and the first, second and third switching regulators 710, 730 and 750 are omitted in FIGS. 10A and 10B, for convenience of illustration.

A second input phase-to-voltage converter 430b, a third voltage-to-delay converter 550b and a second output phase-to-voltage converter 630b in FIG. 10B may be similar to the first input phase-to-voltage converter 410b, the second voltage-to-delay converter 530b and the first output phase-to-voltage converter 610b in FIG. 10A, respectively.

The second input phase-to-voltage converter 430b may include a flip-flop FF3, a resistor RF3 and a capacitor CF3, and may further include an inverter INV3. The flip-flop FF3 may generate a third phase difference pulse signal based on the power supply voltage VDD, the second reference clock signal CK2 and the third reference clock signal CK3. The resistor RF3 may include a first electrode receiving the third phase difference pulse signal, and a second electrode connected to a node outputting the second input phase difference voltage VCK23. The capacitor CF3 may be connected between the second electrode of the resistor RF3 and the ground voltage VSS.

The second output phase-to-voltage converter 630b may include a flip-flop FF4, a resistor RF4 and a capacitor CF4, and may further include an inverter INV4. The flip-flop FF4 may generate a fourth phase difference pulse signal based on the power voltage VDD, the second power switching signal S_LX2 and the third power switching signal S_LX3. The resistor RF4 may include a first electrode receiving the fourth phase difference pulse signal, and a second electrode connected to a node outputting the second output phase difference voltage VLX23. The capacitor CF4 may be connected between the second electrode of the resistor RF4 and the ground voltage VSS.

The third voltage-to-delay converter 550b may include a resistor R3, an amplifier A3, a transistor M3 and a delay line DL3. The resistor R3 may include a first electrode connected to a node N1 to receive the second reference voltage VREF2, and a second electrode connected to a node outputting the third reference voltage VREF3. The amplifier A3 may include a first input terminal receiving the second input phase difference voltage VCK23, a second input terminal receiving the second output phase difference voltage VLX23, and an output terminal connected to the node outputting the third reference voltage VREF3. The transistor M3 may include a first electrode receiving the power supply voltage VDD, a control electrode receiving the third reference voltage VREF3, and a second electrode outputting a feedback voltage VFB3. The delay line DL3 may generate the third input clock signal CK_IN3 by delaying the phase of the third reference clock signal CK3 based on the feedback voltage VFB3.

To implement the above-described direct sensing scheme, the first, second and third voltage-to-delay converters 510b, 530b and 550b may be sequentially connected in series or a cascade manner. Although not illustrated in FIG. 10B, when the voltage converter further includes a fourth voltage-to-delay converter, the fourth voltage-to-delay converter may be connected to a node N2.

Figure 11:
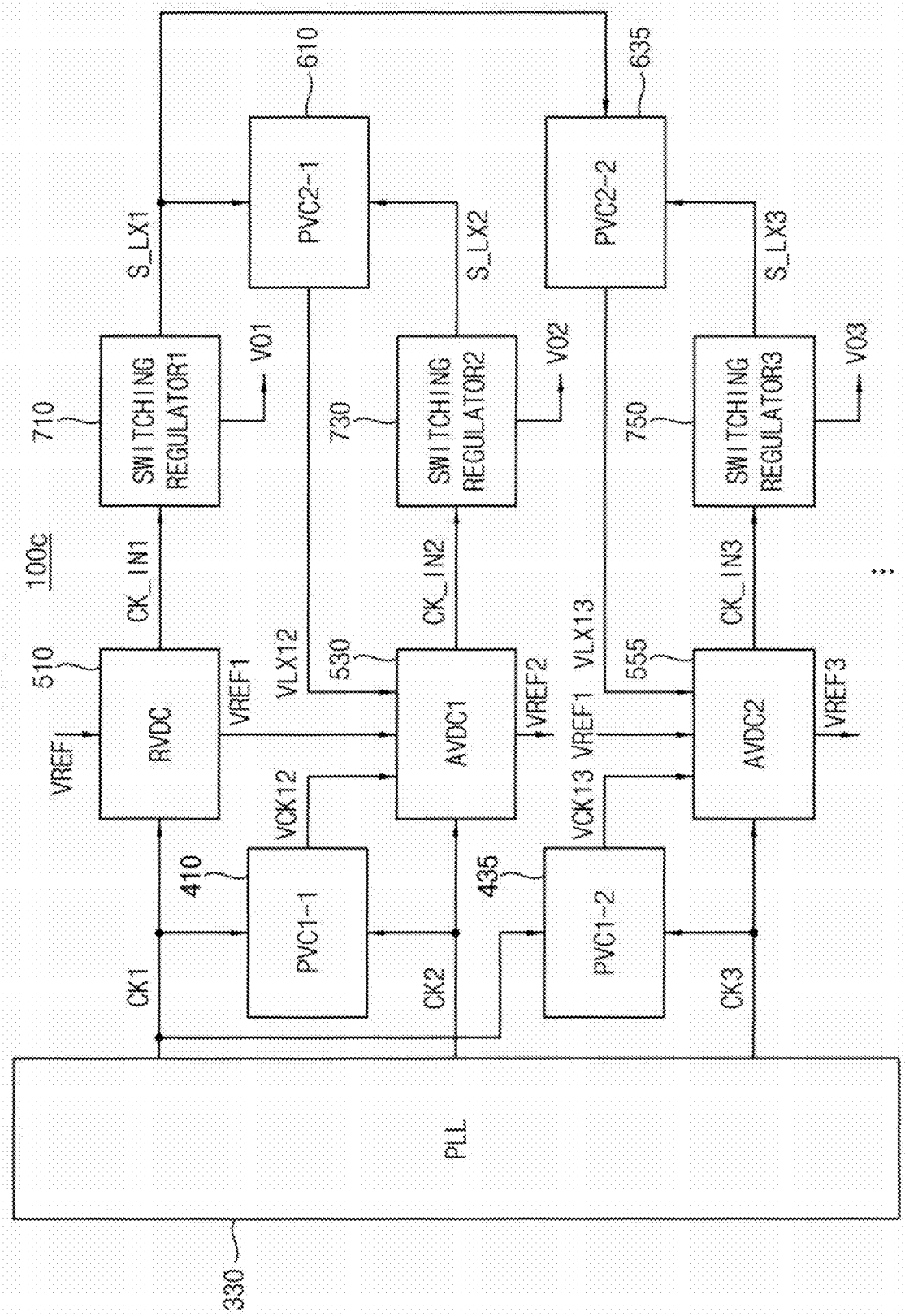
FIG. 11 is a block diagram illustrating still another example of the clock distribution circuit and the voltage converter of FIG. 1.

FIG. 11 is a block diagram illustrating still another example of the clock distribution circuit and the voltage converter of FIG. 1. Some elements are described with reference to FIGS. 2 and 9, and thus descriptions thereof will not repeated here.

Referring to FIG. 11, a voltage converter 100c includes a phase locked loop 330, a first input phase-to-voltage converter 410, a second input phase-to-voltage converter 435, a first voltage-to-delay converter 510, a second voltage-to-delay converter 530, a third voltage-to-delay converter 555, a first output phase-to-voltage converter 610, a second output phase-to-voltage converter 635, a first switching regulator 710, a second switching regulator 730 and a third switching regulator 750.

The voltage converter 100c of FIG. 11 may be the same as or substantially similar to the voltage converter 100a of FIG. 2, except that the voltage converter 100c further includes the second input phase-to-voltage converter 435, the third voltage-to-delay converter 555, the second output phase-to-voltage converter 635 and the third switching regulator 750.

The second input phase-to-voltage converter 435 may generate a second input phase difference voltage VCK13 based on (e.g., by detecting) a phase difference between the first reference clock signal CK1 and the third reference clock signal CK3. The second output phase-to-voltage converter 635 may generate a second output phase difference voltage VLX13 based on (e.g., by detecting) a phase difference between the first power switching signal S_LX1 and the third power switching signal S_LX3.

The third voltage-to-delay converter 555 may generate a third reference voltage VREF3 based on the first reference voltage VREF1, may generate the third input clock signal CK_IN3 by shifting a phase of the third reference clock signal CK3 based on the third reference voltage VREF3, and may additionally control a phase of the third input clock signal CK_IN3 by additionally adjusting a level of the third reference voltage VREF3 based on the second input phase difference voltage VCK13 and the second output phase difference voltage VLX13.

In some example embodiments, the clock distribution circuit included in the voltage converter 100c may set one of the switching regulators 710, 730 and 750 as a reference switching regulator, and may perform an adjustable phase control operation by comparing inputs and outputs of the reference switching regulator and each of switching regulators other than the reference switching regulator with each other. For example, the first switching regulator 710 may be set as the reference switching regulator. The second voltage-to-delay converter 530 may perform the adjustable phase control operation associated with or with respect to the first and second switching regulators 710 and 730, and the third voltage-to-delay converter 555 may perform the adjustable phase control operation associated with or with respect to the first and third switching regulators 710 and 750. As described above, a scheme of comparing clocks and switching nodes between switching regulators using the reference switching regulator may be referred to as an indirect sensing scheme.

Although FIG. 11 illustrates the example where the voltage converter 100c includes three switching regulators 710, 730 and 750 and is implemented with the indirect sensing scheme, example embodiments are not limited thereto. For example, the voltage converter 100c may further include a third input phase-to-voltage converter, a fourth voltage-to-delay converter, a third output phase-to-voltage converter and a fourth switching regulator, and the fourth voltage-to-delay converter may perform the adjustable phase control operation associated with the first and fourth switching regulators based on the indirect sensing scheme.

Figure 12A:
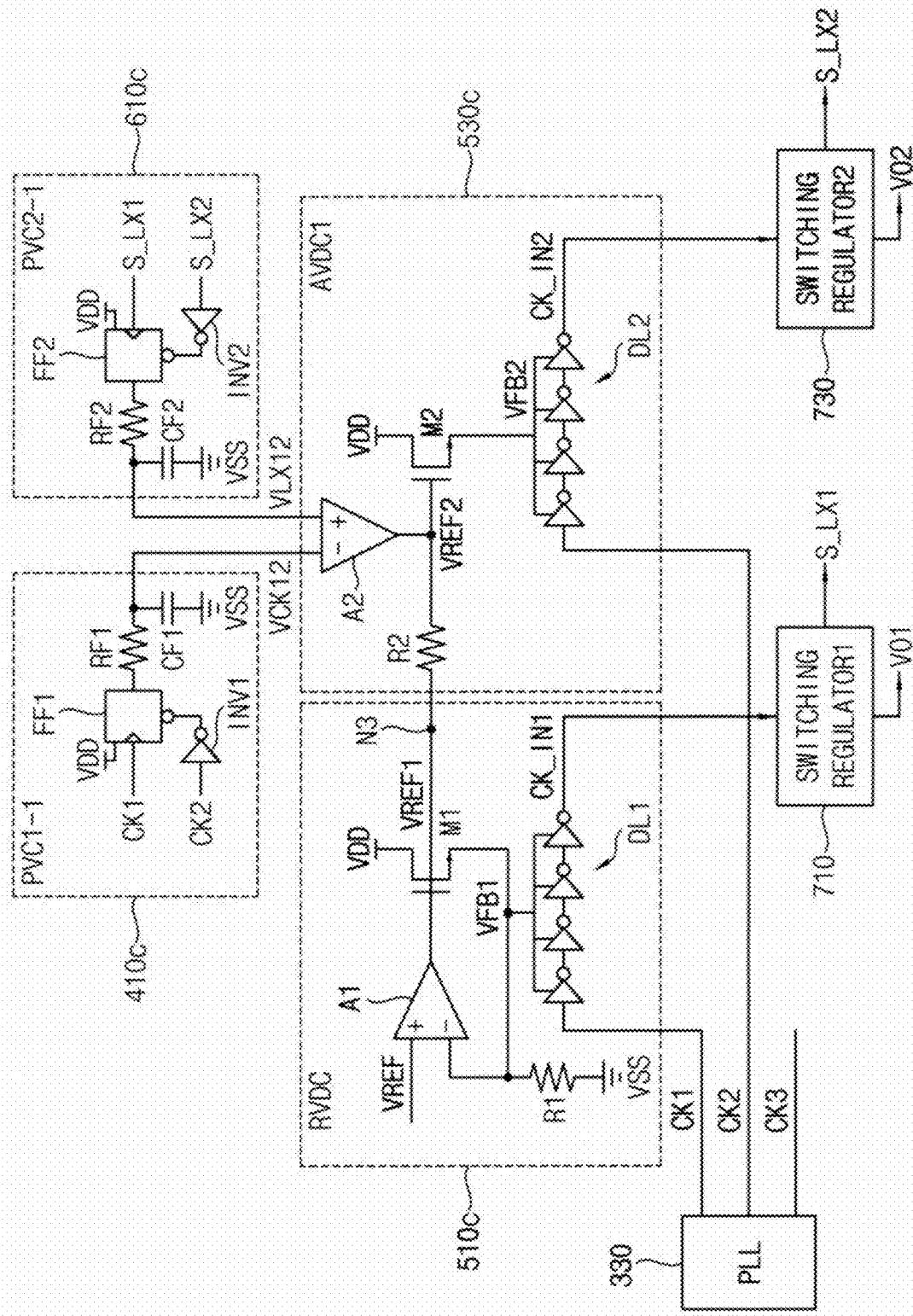
FIGS. 12A and 12B are circuit diagrams illustrating a detailed example of the clock distribution circuit and the voltage converter of FIG. 11.
Figure 12B:
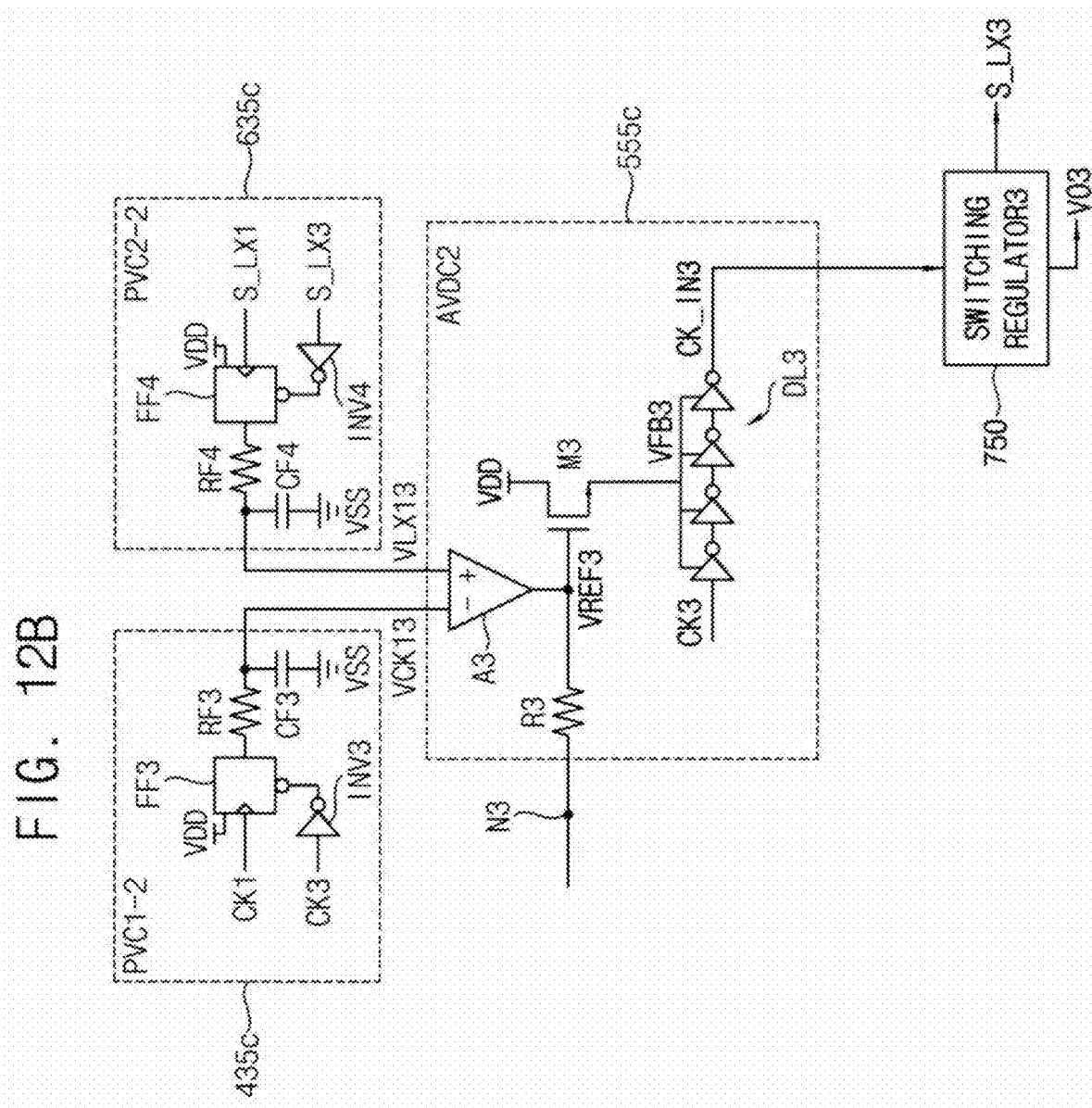

FIGS. 12A and 12B are circuit diagrams illustrating a detailed example of the clock distribution circuit and the voltage converter of FIG. 11. Some elements are described with reference to FIGS. 6, 10A and 10B, and thus descriptions thereof will not be repeated here.

Referring to FIGS. 12A and 12B, a first input phase-to-voltage converter 410c, a first voltage-to-delay converter 510c, a second voltage-to-delay converter 530c and a first output phase-to-voltage converter 610c in FIG. 12A may be the same as or substantially similar to the first input phase-to-voltage converter 410a, the first voltage-to-delay converter 510a, the second voltage-to-delay converter 530a and the first output phase-to-voltage converter 610a in FIG. 6, respectively. Detailed configurations of the phase locked loop 330 and the switching regulators 710, 730 and 750 are omitted in FIGS. 12A and 12B.

A second input phase-to-voltage converter 435c and a second output phase-to-voltage converter 635c in FIG. 12B may be the same as or substantially similar to the second input phase-to-voltage converter 430b and the second output phase-to-voltage converter 630b in FIG. 10B, respectively, except that input and output signals of the second input phase-to-voltage converter 435c and the second output phase-to-voltage converter 635c are changed. A third voltage-to-delay converter 555c in FIG. 12B may be the same as or substantially similar to the third voltage-to-delay converter 550b in FIG. 10B, except that the third voltage-to-delay converter 555c is connected to a node N3

To implement the above-described indirect sensing scheme, the second and third voltage-to-delay converters 530c and 555c may be commonly connected to the node N3 of the first voltage-to-delay converter 510c. Although not illustrated in FIG. 12B, when the voltage converter further includes a fourth voltage-to-delay converter, the fourth voltage-to-delay converter may also be connected to the node N3.

FIG. 13 is a flowchart illustrating a clock distribution method according to some example embodiments.

Referring to FIG. 13, in a clock distribution method according to some example embodiments, reference clock signals (e.g., the reference clock signals CK1 and CK2 in FIG. 2) are generated (step S100). Input clock signals (e.g., the input clock signals CK_IN1 and CK_IN2 in FIG. 2) are generated based on the reference clock signals, and the input clock signals are provided to switching regulators (e.g., the switching regulators 710 and 730 in FIG. 2) (step S200). For example, step S100 may be performed by the phase locked loop, and step S200 may be performed by the voltage-to-delay converter.

A phase difference between two of the reference clock signals is detected to generate an input phase difference voltage (e.g., the input phase difference voltage VCK12 in FIG. 2) (step S300). For example, step S300 may be performed by the phase-to-voltage converter.

A phase difference between two of power switching signals (e.g., the power switching signals S_LX1 and S_LX2 in FIG. 2) received from the switching regulators is detected to generate an output phase difference voltage (e.g., the output phase difference voltage VLX12 in FIG. 2) (step S400). For example, step S400 may be performed by the phase-to-voltage converter.

A phase of at least one of the input clock signals (e.g., the input clock signal CK_IN2 in FIG. 2) is controlled or adjusted based on the detection results of steps S300 and S400 (e.g., based on the input phase difference voltage and the output phase difference voltage) (step S500). For example, step S500 may be performed by the voltage-to-delay converter.

By the recursive or repetitive operation of steps S300, S400 and S500, the clock phase difference generated from the phase locked loop may be accurately and finally implemented as the switching phase difference between the switching regulators.

FIG. 14 is a block diagram illustrating an electronic system including a voltage converter according to some example embodiments.

Referring to FIG. 14, an electronic system 1000 may include a processor 1100, a radio frequency integrated circuit (RFIC) 1200, a power management integrated circuit (PMIC) 1300, a power supply module 1400, a wireless local area network (WLAN) module 1500, a sensor 1600, a fingerprint recognition module 1700, a touch screen controller 1800 and a digital display interface (DDI) module 1900.

The processor 1100 may control overall operations of the electronic system 1000. For example, the processor 1100 may be implemented as a baseband modem processor chip, a chip which can function as both a modem and an application processor (AP), an AP, or a mobile AP, but example embodiments are not limited thereto. The processor 1100 may operate as a master device.

Each of the RFIC 1200, the PMIC 1300, the power supply module 1400, the WLAN module 1500, the sensor 1600, the fingerprint recognition module 1700, the touch screen controller 1800 and the DDI module 1900 may operate as a slave device. The RFIC 1200 may include at least one connectivity chip. For example, the connectivity chip may include a chip 1210 for mobile communication, a chip 1220 for WLAN, a chip 1230 for Bluetooth communication, a chip 1240 for Global Navigation Satellite System (GNSS) communication, a chip 1250 for processing FM audio/video, Near Field Communication (NFC), and/or a chip 1260 for NFC, but example embodiments are not limited thereto.

The PMIC 1300 may manage power of the electronic system 1000, and may include a voltage converter 1310 and a clock distribution circuit 1320 according to example embodiments.

Figure 15:
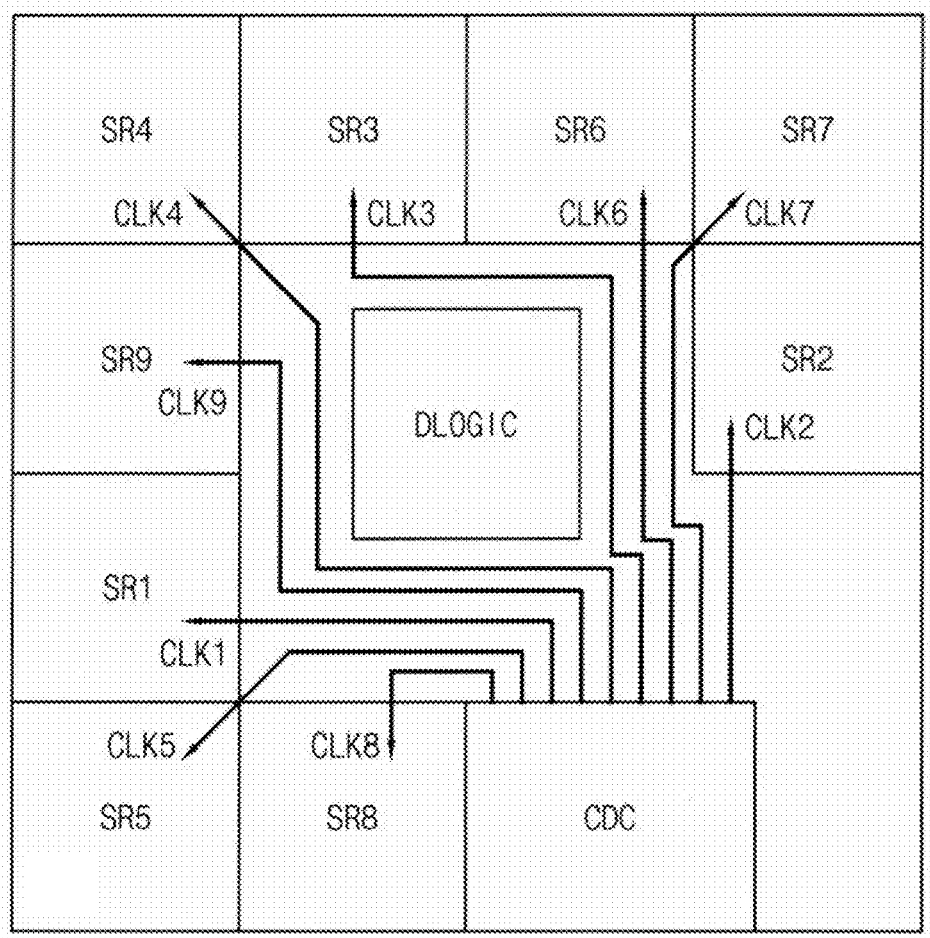
FIG. 15 is a block diagram illustrating an example of a PMIC included in the electronic system of FIG. 14.

FIG. 15 is a block diagram illustrating an example of a PMIC included in the electronic system of FIG. 14.

Referring to FIG. 15, the PMIC 1300 may include a digital logic DLOGIC, a clock distribution circuit CDC and switching regulators SR1, SR2, SR3, SR4, SR5, SR6, SR7, SR8 and SR9. The clock distribution circuit CDC may generate, supply and/or distribute clock signals CLK1, CLK2, CLK3, CLK4, CLK5, CLK6, CLK7, CLK8 and CLK9, and may perform the adjustable phase control operation according to some example embodiments. The switching regulators SR1 to SR9 may generate output voltages based on the clock signals CLK1 to CLK9. The number of the switching regulators SR1 to SR9 may be changed according to some example embodiments.

As illustrated in FIG. 15, a clock routing may be formed between the clock distribution circuit CDC and the switching regulators SR1 to SR9. If there is a delay due to parasitic components such as parasitic capacitance for each transmission line and/or if the mechanisms for processing the clocks inside the switching regulators SR1 to SR9 are different for each switching regulator, the switching times of the switching regulators SR1 to SR9 may overlap with each other. When the adjustable phase control operation is performed using the clock distribution circuit CDC according to some example embodiments, the above-described overlapping of the switching times may be mitigated or prevented.

The inventive concept may be applied to various electronic devices and/or systems that require voltage conversion. For example, the inventive concept may be applied to systems such as a personal computer (PC), a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The various modules, controllers, processors and/or elements described above may be implemented using hardware components, software components, and/or a combination thereof. For example, the various modules, controllers, processors and/or elements described herein may be implemented processing circuitry such as hardware including logic circuits, a processing unit including software and a core executing the software, or a combination of the hardware and the processing unit. For example, the various modules, controllers, processors and/or elements described herein may include, but is not limited to, a processor, Central Processing Unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A clock distribution circuit comprising:
    a phase locked loop (PLL) configured to generate a plurality of reference clock signals;
    a first phase detecting and converting circuit configured to generate a plurality of input phase difference voltages based on phase differences between respective pairs of two reference clock signals among the plurality of reference clock signals;
    a second phase detecting and converting circuit configured to generate a plurality of output phase difference voltages based on phase differences between respective pairs of two power switching signals among a plurality of power switching signals received from a plurality of external switching regulators; and
    a clock generating and compensating circuit configured to,
        generate a plurality of input clock signals to be provided to the plurality of external switching regulators by shifting phases of the plurality of reference clock signals, and
        control a phase of at least one of the plurality of input clock signals based on the plurality of input phase difference voltages and the plurality of output phase difference voltages.

2. The clock distribution circuit of claim 1, wherein
    the plurality of reference clock signals include a first reference clock signal and a second reference clock signal,
    the plurality of external switching regulators include a first external switching regulator and a second external switching regulator,
    the plurality of input clock signals include a first input clock signal and a second input clock signal,
    the plurality of power switching signals include a first power switching signal and a second power switching signal, and
    the clock generating and compensating circuit is configured to adjust a phase of one of the first and second input clock signals based on one of the plurality of input phase difference voltages and one of the plurality of output phase difference voltages such that a phase difference between the first and second power switching signals received from the first and second external switching regulators is equal to a phase difference between the first and second reference clock signals, based on which the first and second input clock signals to be provided to the first and second external switching regulators are generated.

3. The clock distribution circuit of claim 1, wherein the clock generating and compensating circuit includes:
    a first voltage-to-delay converter (VDC) configured to generate a first reference voltage based on an input reference voltage, and generate a first input clock signal by shifting a phase of a first reference clock signal based on the first reference voltage; and
    a second voltage-to-delay converter configured to,
        generate a second reference voltage based on the first reference voltage,
        generate a second input clock signal by shifting a phase of a second reference clock signal based on the second reference voltage, and
        control a phase of the second input clock signal by adjusting a level of the second reference voltage based on a first input phase difference voltage and a first output phase difference voltage.

4. The clock distribution circuit of claim 3, wherein the first voltage-to-delay converter includes:
    a first amplifier including a first input terminal configured to receive the input reference voltage, a second input terminal connected to a first resistor, and an output terminal at which the first reference voltage is outputted;
    a first transistor including a first electrode configured to receive a power supply voltage, a control electrode configured to receive the first reference voltage, and a second electrode at which a first feedback voltage is outputted; and
    a first delay line configured to generate the first input clock signal by delaying the phase of the first reference clock signal based on the first feedback voltage.

5. The clock distribution circuit of claim 4, wherein the second voltage-to-delay converter includes:
    a second resistor including a first electrode configured to receive the first reference voltage, and a second electrode connected to a first node at which the second reference voltage is outputted;
    a second amplifier including a first input terminal configured to receive the first input phase difference voltage, a second input terminal configured to receive the first output phase difference voltage, and an output terminal connected to the first node;
    a second transistor including a first electrode configured to receive the power supply voltage, a control electrode configured to receive the second reference voltage, and a second electrode at which a second feedback voltage is outputted; and
    a second delay line configured to generate the second input clock signal by delaying the phase of the second reference clock signal based on the second feedback voltage.

6. The clock distribution circuit of claim 3, wherein the first phase detecting and converting circuit includes:
    a first input phase-to-voltage converter (PVC) configured to generate the first input phase difference voltage based on a phase difference between the first reference clock signal and the second reference clock signal.

7. The clock distribution circuit of claim 6, wherein the first input phase-to-voltage converter includes:
    a first edge detector configured to generate a first phase difference pulse signal based on edges of the first reference clock signal and the second reference clock signal; and
    a first low pass filter (LPF) configured to convert the first phase difference pulse signal into the first input phase difference voltage.

8. The clock distribution circuit of claim 7, wherein the first edge detector includes:
a first flip-flop configured to generate the first phase difference pulse signal based on the first reference clock signal, the second reference clock signal and a power supply voltage.

9. The clock distribution circuit of claim 7, wherein the first low pass filter includes:
a first resistor including a first electrode receiving the first phase difference pulse signal, and a second electrode connected to a first node at which the first input phase difference voltage is outputted; and
a first capacitor connected between the first node and a ground voltage.

10. The clock distribution circuit of claim 3, wherein the second phase detecting and converting circuit includes:
a first output phase-to-voltage converter configured to generate the first output phase difference voltage based on a phase difference between a first power switching signal and a second power switching signal among the plurality of power switching signals.

11. The clock distribution circuit of claim 3, wherein the clock generating and compensating circuit further includes:
a third voltage-to-delay converter configured to generate a third reference voltage based on the second reference voltage, generate a third input clock signal by shifting a phase of a third reference clock signal based on the third reference voltage, and control a phase of the third input clock signal by adjusting a level of the third reference voltage based on a second input phase difference voltage and a second output phase difference voltage.

12. The clock distribution circuit of claim 11, wherein the first phase detecting and converting circuit includes:
a first input phase-to-voltage converter configured to generate the first input phase difference voltage by detecting a phase difference between the first reference clock signal and the second reference clock signal; and
a second input phase-to-voltage converter configured to generate the second input phase difference voltage by detecting a phase difference between the second reference clock signal and the third reference clock signal.

13. The clock distribution circuit of claim 11, wherein the second phase detecting and converting circuit includes:
a first output phase-to-voltage converter configured to generate the first output phase difference voltage by detecting a phase difference between a first power switching signal and a second power switching signal; and
a second output phase-to-voltage converter configured to generate the second output phase difference voltage by detecting a phase difference between the second power switching signal and a third power switching signal.

14. The clock distribution circuit of claim 3, wherein the clock generating and compensating circuit further includes:
a third voltage-to-delay converter configured to generate a third reference voltage based on the first reference voltage, generate a third input clock signal by shifting a phase of a third reference clock signal based on the third reference voltage, and control a phase of the third input clock signal by adjusting a level of the third reference voltage based on a second input phase difference voltage and a second output phase difference voltage.

15. The clock distribution circuit of claim 14, wherein the first phase detecting and converting circuit includes:

a first input phase-to-voltage converter configured to generate the first input phase difference voltage by detecting a phase difference between the first reference clock signal and the second reference clock signal; and
a second input phase-to-voltage converter configured to generate the second input phase difference voltage by detecting a phase difference between the first reference clock signal and the third reference clock signal.

16. The clock distribution circuit of claim 14, wherein the second phase detecting and converting circuit includes:
a first output phase-to-voltage converter configured to generate the first output phase difference voltage by detecting a phase difference between a first power switching signal and a second power switching signal; and
a second output phase-to-voltage converter configured to generate the second output phase difference voltage by detecting a phase difference between the first power switching signal and a third power switching signal.

17. A voltage converter comprising:
a clock distribution circuit configured to generate a plurality of input clock signals, and adaptively adjust a phase of at least one of the plurality of input clock signals; and
a plurality of switching regulators including a plurality of power switching nodes, the plurality of switching regulators configured to generate a plurality of output voltages based on the plurality of input clock signals,
wherein the clock distribution circuit includes,
a phase locked loop (PLL) configured to generate a plurality of reference clock signals,
a first phase detecting and converting circuit configured to generate a plurality of input phase difference voltages based on phase differences between respective pairs of two reference clock signals among the plurality of reference clock signals,
a second phase detecting and converting circuit configured to generate a plurality of output phase difference voltages based on phase differences between respective pairs of two power switching signals among a plurality of power switching signals received from the plurality of power switching nodes, and
a clock generating and compensating circuit configured to generate the plurality of input clock signals by shifting phases of the plurality of reference clock signals, and control the phase of the at least one of the plurality of input clock signals based on the plurality of input phase difference voltages and the plurality of output phase difference voltages.

18. The voltage converter of claim 17, wherein the clock generating and compensating circuit is configured to perform an adjustable phase control operation based on inputs and outputs of two switching regulators, the two switching regulators being adjacent to each other and included in the plurality of switching regulators.

19. The voltage converter of claim 17, wherein the clock generating and compensating circuit is configured to set one of the plurality of switching regulators as a reference switching regulator, and perform an adjustable phase control operation based on an input and an output of the reference switching regulator and each of the plurality of switching regulators other than the reference switching regulator.

20. A clock distribution circuit comprising:
a phase locked loop (PLL) configured to generate a first reference clock signal and a second reference clock signal;

a first input phase-to-voltage converter (PVC) configured to generate a first input phase difference voltage based on a phase difference between the first reference clock signal and the second reference clock signal;

a first output phase-to-voltage converter configured to generate a first output phase difference voltage based on a phase difference between a first power switching signal and a second power switching signal that are received from a first power switching node of a first external switching regulator and a second power switching node of a second external switching regulator, respectively, the first external switching regulator and the second external switching regulator being adjacent to each other;

a first voltage-to-delay converter (VDC) configured to generate a first reference voltage based on an input reference voltage, and generate a first input clock signal to be provided to the first external switching regulator by shifting a phase of the first reference clock signal based on the first reference voltage; and a second voltage-to-delay converter configured to generate a second reference voltage based on the first reference voltage, generate a second input clock signal to be provided to the second external switching regulator by shifting a phase of the second reference clock signal based on the second reference voltage, and control a phase of the second input clock signal by adjusting a level of the second reference voltage based on the first input phase difference voltage and the first output phase difference voltage, and wherein the phase of the second input clock signal is adjusted such that the phase difference between the first power switching signal and the second power switching signal is equal to the phase difference between the first reference clock signal and the second reference clock signal.

* * * * *